United States Patent
Yamano et al.

(10) Patent No.: US 7,811,857 B2
(45) Date of Patent: Oct. 12, 2010

(54) METHOD OF MANUFACTURING SEMICONDUCTOR DEVICE

(75) Inventors: Takaharu Yamano, Nagano (JP); Yoichi Harayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1261 days.

(21) Appl. No.: 11/102,967

(22) Filed: Apr. 8, 2005

(65) Prior Publication Data

US 2006/0014320 A1    Jan. 19, 2006

Related U.S. Application Data

(63) Continuation of application No. PCT/JP2004/010205, filed on Jul. 16, 2004.

(51) Int. Cl.
*H01L 21/00*    (2006.01)
(52) U.S. Cl. ............... 438/113; 438/124; 438/459; 438/460; 257/E21.001
(58) Field of Classification Search ........... 438/113, 438/114, 462, 464, 124, 459, 460; 257/E21.001
See application file for complete search history.

(56) References Cited

U.S. PATENT DOCUMENTS

| | | | |
|---|---|---|---|
| 6,107,164 A | 8/2000 | Ohuchi | |
| 6,329,288 B1 | 12/2001 | Tokushige et al. | |
| 6,479,900 B1 * | 11/2002 | Shinogi et al. | 257/758 |
| 6,600,234 B2 * | 7/2003 | Kuwabara et al. | 257/790 |
| 6,607,970 B1 * | 8/2003 | Wakabayashi | 438/462 |
| 6,656,758 B1 * | 12/2003 | Shinogi et al. | 438/33 |
| 6,818,475 B2 * | 11/2004 | Yang et al. | 438/113 |
| 7,417,311 B2 * | 8/2008 | Yamano | 257/707 |
| 7,468,292 B2 * | 12/2008 | Yamano | 438/113 |
| 2002/0055238 A1 * | 5/2002 | Sugino et al. | 438/459 |
| 2003/0190795 A1 * | 10/2003 | Kawakami | 438/462 |
| 2005/0112800 A1 * | 5/2005 | Yamano | 438/113 |
| 2006/0014320 A1 * | 1/2006 | Yamano et al. | 438/113 |
| 2007/0032066 A1 * | 2/2007 | Yamano | 438/613 |

FOREIGN PATENT DOCUMENTS

| | | |
|---|---|---|
| JP | 2000-68401 | 3/2000 |
| JP | 2000-228412 | 8/2000 |
| JP | 2001-168231 | 6/2001 |
| JP | 2002-231854 | 8/2002 |
| JP | 2002-270720 | 9/2002 |

* cited by examiner

*Primary Examiner*—Jack Chen
(74) *Attorney, Agent, or Firm*—Kratz, Quintos & Hanson, LLP

(57) ABSTRACT

Insulating films (13, 14) are formed on the surface of a semiconductor wafer (30) on the side on which a plurality of devices are formed. Then, conductor layers (15, 16) are formed to cover opening portions from which electrode pads (12) of each device are exposed. Furthermore, a resist layer (R2) is formed to have opening portions from which terminal formation portions of the conductor layer are exposed, and metal posts (17) are formed on the terminal formation portions of the conductor layer (16) using the resist layer (R2) as a mask. Then, thinning of the semiconductor wafer (30) is performed to a predetermined thickness by grinding the back surface thereof. Thereafter, the resist layer (R2) is removed; an unnecessary portion (15) of the conductor layer is further removed; sealing with sealing resin is performed with the top portions of the metal posts (17) being exposed; metal bumps are bonded to the top portions of the metal posts (17); and the semiconductor wafer is divided into each device.

9 Claims, 12 Drawing Sheets

MARKING BY CO₂ LASER

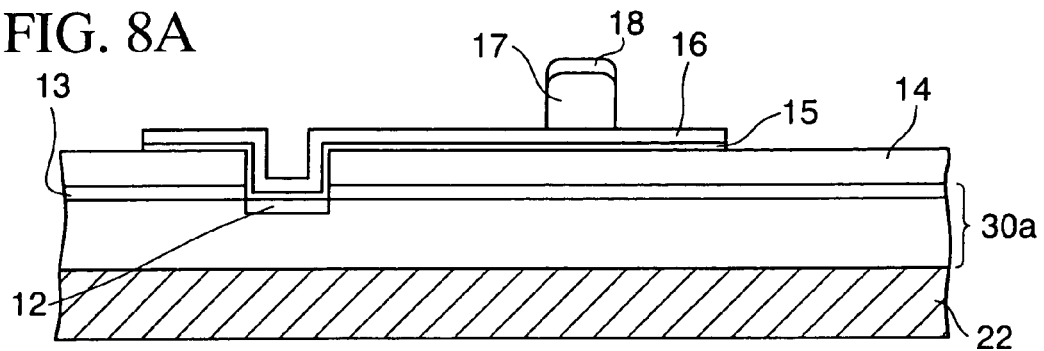
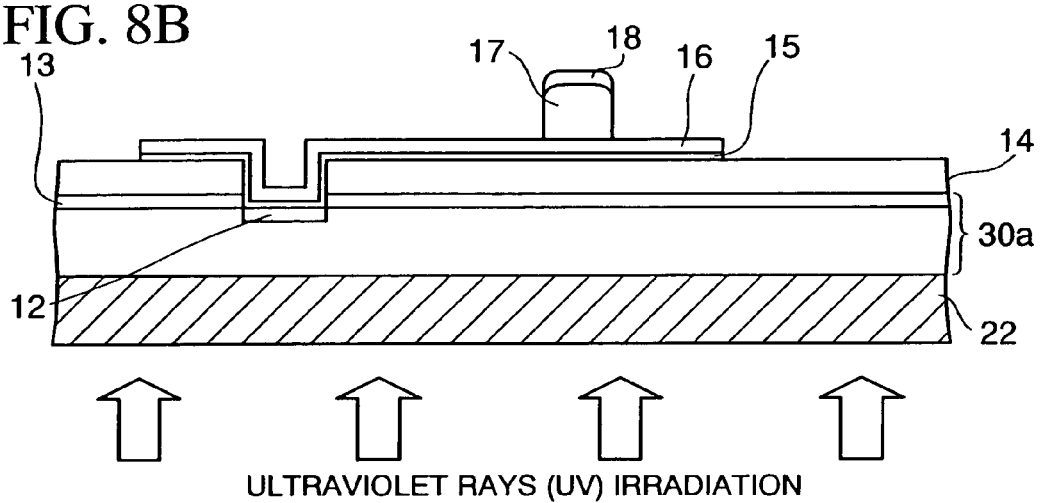
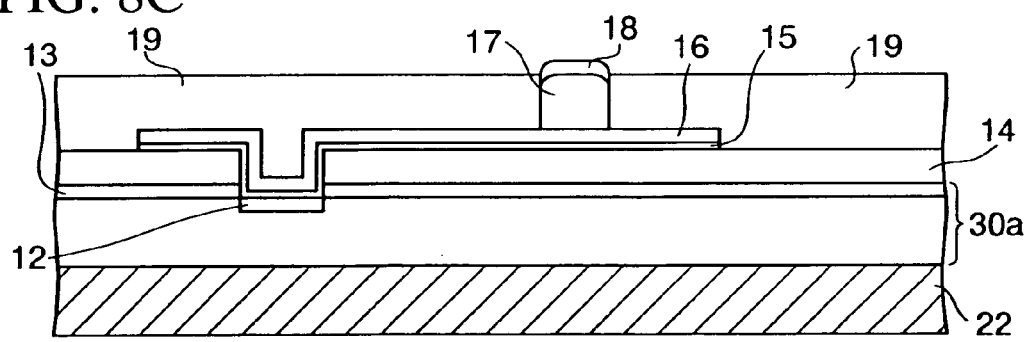
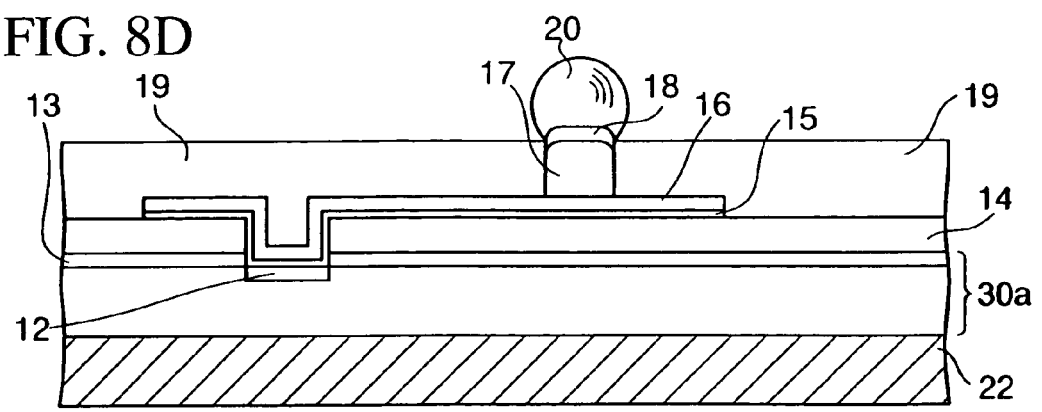

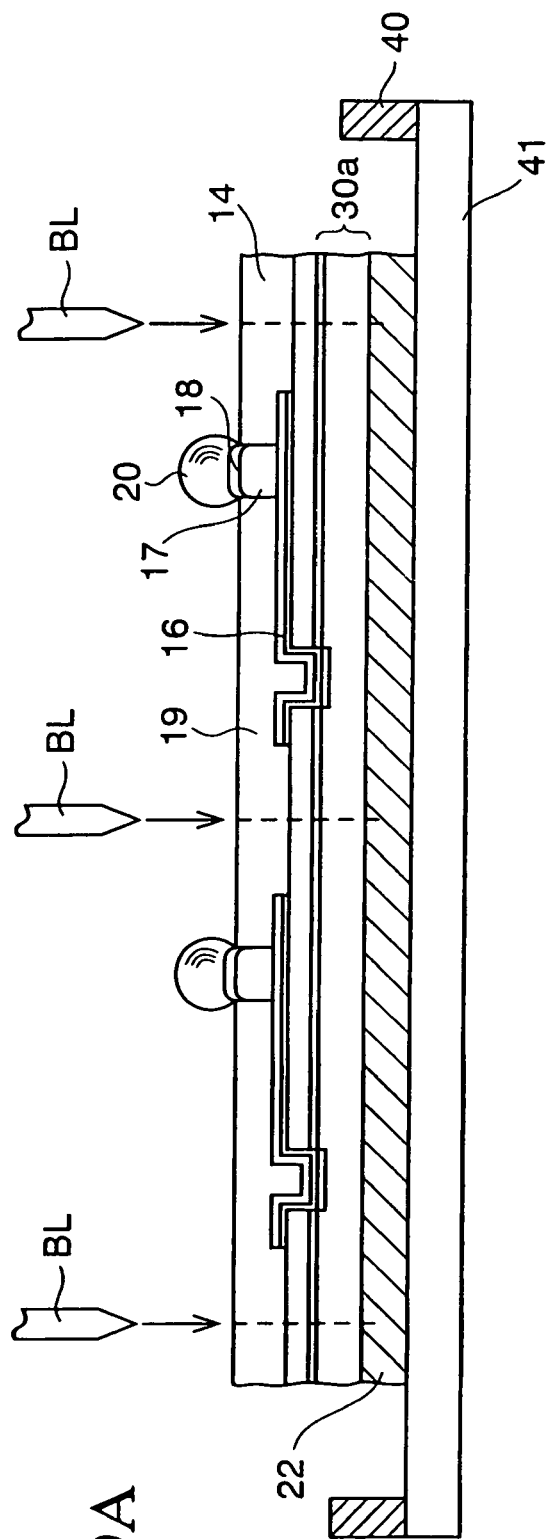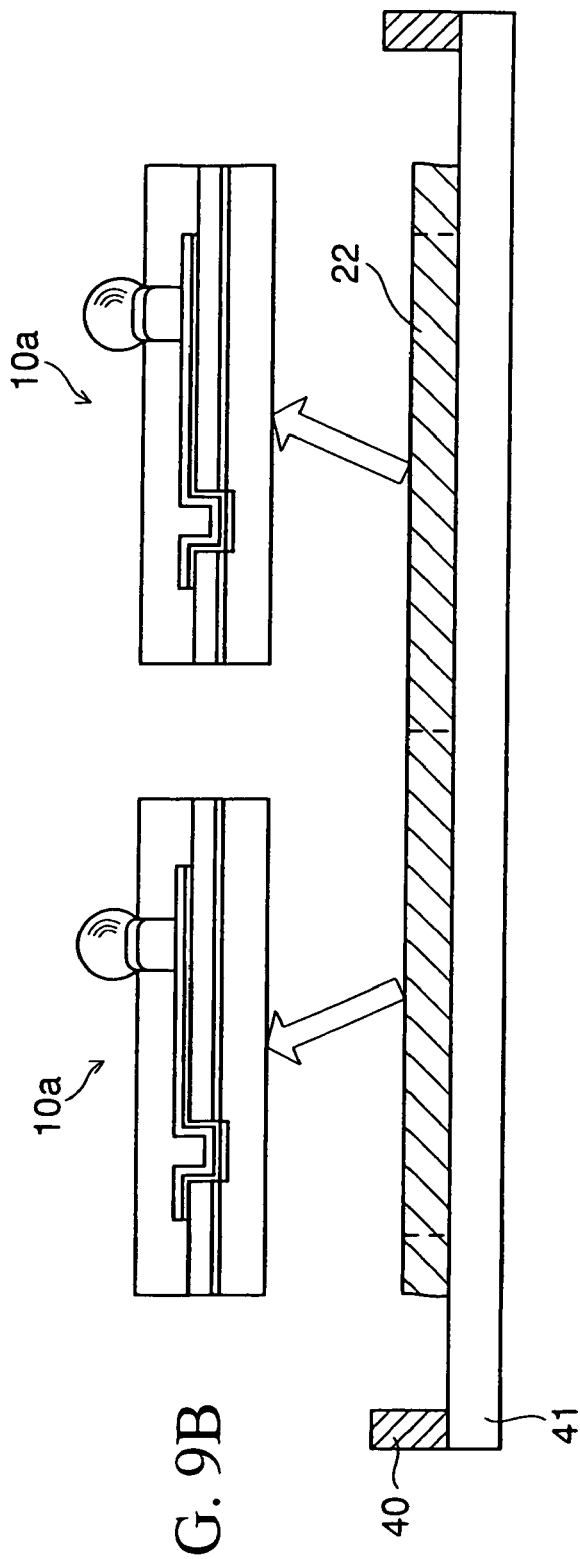

US 7,811,857 B2

METHOD OF MANUFACTURING SEMICONDUCTOR DEVICE

This application is a continuation of international application PCT/JP04/10205 filed Jul. 16, 2004.

TECHNICAL FIELD

The present invention relates to a method of manufacturing a semiconductor device, and particularly, to a method of manufacturing a semiconductor device, which includes a back grinding process for thinning a wafer in a wafer-level package having a plurality of devices formed therein.

It is noted that, in the description hereinbelow, unless otherwise defined, a "semiconductor device" means even an individual semiconductor element (device) which is being formed in a wafer and is still in an uncut or undivided state, as well as an individual semiconductor chip (device) after being cut out and divided from a wafer.

BACKGROUND ART

In recent years, with the demand for miniaturization of electronic instruments and devices, attempts are being made to miniaturize and densify semiconductor devices used in the electronic instruments and devices. Accordingly, semiconductor devices having a chip-scale package (CSP) structure, in which the miniaturization has been achieved by making the shape of a semiconductor device as close as possible to the shape of a semiconductor element (semiconductor chip), have been developed and fabricated.

In a typical semiconductor device having a CSP structure, a passivation film (insulating film) as a protective film is formed on the surface on a side of a semiconductor wafer where devices are formed, and a reroute layer (reroute pattern) for linking a wiring layer (electrode pads) of each device to the outside of a package through via holes formed at predetermined positions in the insulating film is formed on the insulating film. Further, metal posts are provided on terminal formation portions of the reroute layer, and the entire surface of the side where the metal posts are formed is sealed with sealing resin (except that the top portions of the metal posts are exposed). Furthermore, metal bumps as external connection terminals are bonded to the top portions of the metal posts.

For various kinds of devices including flash memories, DRAMs, and the like, to which semiconductor devices having the relevant CSP structure are applied, the future trend is that the demand for thinning of wafer-level packages in a stage before being divided into individual semiconductor chips is still more increasing. Therefore, a process of grinding the back surface of a wafer is generally performed in order to attempt the thinning.

In a conventional wafer-level package manufacturing process, a process of grinding the back surface of a wafer is performed in the initial stage. Namely, the wafer is thinned by a back grinding (BG) process of a typical method using a wafer back grinding machine, in a stage after a plurality of devices have been formed in the semiconductor wafer (i.e., in a stage before a passivation film (insulating film) is formed on the wafer surface), and then the subsequent steps are performed.

In a process relating to a wafer back grinding process, when the back grinding is performed, a tape for protecting a pattern surface (for convenience, hereinafter, such a tape will be referred to as a "BG tape") is attached thereto. Here, the back grinding required a dedicated laminator for attaching the BG tape thereto, a dedicated remover for stripping off the BG tape after the wafer back grinding, and further, a stripping tape when the BG tape is stripped off. The BG tape used in the back grinding has the function of planarizing the surface of the side where a pattern is formed, as well as the function of protecting the pattern surface. Accordingly, as the BG tape, a tape of a thick-film type which can accommodate irregularities of the surface is generally used.

Technologies relating to the back grinding process for thinning a wafer as described above include, for example, one in which a wafer back surface is ground after resin sealing (as examples, refer to Patent Documents 1 and 2).

Patent Document 1: Japanese Unexamined Patent Publication No. 2002-270720, and

Patent Document 2: Japanese Unexamined Patent Publication No. 2002-231854.

As described above, in the conventional wafer-level package manufacturing steps, a BG tape of a thick-film type is needed in a process relating to a wafer back grinding. The BG tape of the thick-film type is very expensive. In addition, a dedicated laminator and a dedicated remover (including a stripping tape) are also essential. Accordingly, there is a serious obstacle in terms of cost (increase in manufacturing cost) in realizing the thinning of a wafer-level package Moreover, in the wafer-level package manufacturing process, the wafer back grinding process is performed in the initial stage, and all subsequent steps need to be performed in a state where a wafer is thin (thin-wafer state). Accordingly, there is a high possibility in that a fatal defect of so-called "wafer cracking" will occur during the process.

In order to cope with the defect, for example, it is possible to conceive of refining a holding and carrying mechanism of a device carrier system so that a thin wafer can be handled in such a state that the wafer cracking does not occur. In that case, however, there is a problem in that the cost relating to the device carrier system increases. Additionally, as another method of avoiding the wafer cracking caused by a process in a thin-wafer state, it is possible to conceive of performing a wafer back grinding process in a stage as close as possible to the end (ideally, in the final stages) in a wafer-level package manufacturing process. For example, if a wafer-back grinding process is performed after resin sealing has been performed in an assembly process in the final stage, at least the wafer cracking caused by a process in a thin-wafer state can be avoided.

However, if a wafer-back grinding process is performed after resin sealing, there is a possibility in that wafer cracking due to another cause may occur. Namely, when resin sealing is performed, for example, as shown in FIG. 10A, molding resin (19) is diffused to the peripheral portion of a wafer (30); the diffused molding resin overflows to a wafer edge portion to reach the wafer back surface (i.e., an overflow of the molding resin to the wafer back surface occurs); accordingly, if a wafer back grinding process is performed in such a state as described above, the resin enters a grinding stone whereby only wafer material (silicon) should be essentially ground, to cause clogging; thus, smooth grinding is hindered; and in some cases, there is a risk in that the wafer may crack. Therefore, unless some skills are applied to the process, it is not appropriate to perform a wafer back grinding process after resin sealing.

Further, a later stage which is conceivable as to be the stage for performing a wafer back grinding process is the stage after solder balls have been mounted and reflow has been performed (after the bonding of solder bumps). However, even in this stage, the molding resin is left overflowed to the wafer back surface. Further, an expensive BG tape, a dedicated laminator, and a dedicated remover (including a stripping tape) remain needed. The problem of the increase in the manufacturing cost is left unsolved.

Moreover, there is also a problem in that, when a wafer is thinned, the entire wafer warps during the manufacturing process. For example, when sealing with and a thermal cure of molding resin are performed, a very thin wafer is pulled toward the resin layer side under the influence of the thermal shrinkage of the sealing resin, and the entire wafer warps. Accordingly, processes (solder ball mounting, reflow, dicing, and the like) after the resin sealing step must be performed in the state where the wafer is warped. As described above, conventional technologies have a disadvantage in that, when a wafer-level package is thinned, the entire wafer warps.

As a method of coping with such a disadvantage, it is possible to conceive of, for example, forming a film layer (e.g., an insulating resin film made of epoxy resin, silicone resin, polyimide resin, or the like) for warping correction, on the wafer back surface by vacuum lamination. In this case, an epoxy-, silicone-, or polyimide-based film layer substantially cannot be stripped off after the formation thereof (after a thermal cure process has been performed), and therefore needs to be left as a permanent film. Accordingly, various kinds of reliability tests (test on the reliability of adhesion to the wafer, and the like) need to be performed on the wafer to which the permanent film (film layer for warping correction) is attached.

However, in the above described case, there is the following problem: when the wafer is finally diced to be divided into individual semiconductor chips (devices), chipping, cracking, and the like, occur in each chip due to a mechanical shock during the dicing, and thus delamination occurs between the relevant film layer and the chip back surface. Namely, since delamination of the permanent film (film layer) from the chip back surface occurs after various kinds of reliability tests have been performed, it makes no sense that the reliability tests have been performed.

DISCLOSURE OF THE INVENTION

It is an object of the present invention to provide a method of manufacturing a semiconductor device, which can prevent wafer cracking and which can contribute to a reduction in the manufacturing cost, in realizing the thinning of a wafer-level package.

It is another object of the present invention to provide a method of manufacturing a semiconductor device in which wafer warping is corrected, a warping correction layer on the back surface thereof is handled as a nonpermanent film, and the necessity of various kinds of reliability tests can be eliminated, in realizing the thinning of a wafer-level package.

In order to achieve the aforementioned objects, according to a first aspect of the present invention, a method of manufacturing a semiconductor device is provided, the method comprising the steps of: forming an insulating film on the surface on a side of a semiconductor wafer, the side having a plurality of devices formed thereon, the insulating film having an opening portion from which an electrode pad of each device is exposed; forming a conductor layer on the insulating film, the conductor layer being patterned in a required shape to cover the opening portion from which the electrode pad is exposed; forming a resist layer on the conductor layer, so as to have an opening portion from which a terminal formation portion of the conductor layer is exposed; forming a metal post on the terminal formation portion of the conductor layer with the resist layer being used as a mask; performing thinning of the semiconductor wafer to a predetermined thickness by grinding the surface on a side thereof which is reverse to a side having the metal post formed thereon; sealing a wafer surface with sealing resin with a top portion of the metal post being exposed, after removing the resist layer; bonding a metal bump to the top portion of the metal post; and dividing the semiconductor wafer having the metal bump bonded thereto into each device.

According to the method of manufacturing a semiconductor device of the first aspect, wafer back grinding is performed in a relatively later stage (stage immediately after the metal post has been formed) in a wafer-level package manufacturing process, and a process can be performed in the state where the semiconductor wafer is thick, up to the stage in which the metal post is formed. Accordingly, in realizing the thinning of a wafer-level package, it is possible to prevent an occurrence of "wafer cracking," which is a fatal defect, as observed in conventional technologies.

Further, at the time immediately before the wafer back grinding process is performed, the wafer surface (surface on the side where a pattern is formed) is in an almost planarized state by means of the surface of the metal post and the surface of the resist layer. Accordingly, when back grinding is performed, there is no necessity to attach an expensive BG tape of a thick-film type as used in conventional processes, and therefore the necessity of a dedicated laminator and a dedicated remover (including a stripping tape) is also completely eliminated, thereby greatly contributing to a reduction in the manufacturing cost.

Moreover, according to a modified aspect of the method of manufacturing a semiconductor device of the first aspect, a method of manufacturing a semiconductor device is provided, the method comprising the steps of: forming an insulating film on the surface on a side a semiconductor wafer, the side having a plurality of devices formed thereon, the insulating film having an opening portion from which an electrode pad of each device is exposed; forming a thin metal film on the entire surface of the insulating film, so as to cover the opening portion from which the electrode pad is exposed; forming a resist layer on the thin metal film, the resist layer being patterned in a required shape; forming a reroute layer on the thin metal film with the resist layer being used as a mask; performing thinning of the semiconductor wafer to a predetermined thickness by grinding the surface on a side thereof which is reverse to a side having the reroute layer formed thereon; forming a metal post on a terminal formation portion of the reroute layer, after removing the resist layer; removing the thin metal film exposed from a wafer surface; sealing the wafer surface with sealing resin, with a top portion of the metal post being exposed; bonding a metal bump to the top portion of the metal post; and dividing the semiconductor wafer having the metal bump bonded thereto into each device.

Also in the manufacturing method according to the modified aspect, a wafer back grinding process is performed in a relatively later stage (stage immediately after the reroute layer has been formed) in a wafer-level package manufacturing process, and a process can be performed in a thick-wafer state up to the stage in which the reroute layer is formed. Accordingly, wafer cracking can be prevented. Further, at the time immediately before the wafer back grinding process is performed, the wafer surface is in an almost planarized state by means of the surface of the reroute layer and the surface of the resist layer. Accordingly, when back grinding is performed, there is no necessity to attach an expensive BG tape, and therefore the necessity of a dedicated laminator and a dedicated remover (including a stripping tape) is also eliminated, thereby contributing to a reduction in the manufacturing cost.

Moreover, according to a second aspect of the present invention, a method of manufacturing a semiconductor device is provided, the method comprising the steps of: forming an insulating film on the surface on a side of a semiconductor wafer, the side having a plurality of devices formed thereon, the insulating film having an opening portion from which an electrode pad of each device is exposed; forming a conductor layer on the insulating film, the conductor layer being patterned in a required shape to cover the opening portion from which the electrode pad is exposed; forming a resist layer on the conductor layer, so as to have an opening portion from which a terminal formation portion of the conductor layer is exposed; forming a metal post on the terminal formation portion of the conductor layer with the resist layer being used as a mask; performing thinning of the semiconductor wafer to a predetermined thickness by grinding the surface on a side thereof which is reverse to a side having the metal post formed thereon; forming a film layer having heat resistance, on the surface, to which the thinning has been performed, of the semiconductor wafer; sealing a wafer surface with sealing resin, with a top portion of the metal post being exposed, after removing the resist layer; bonding a metal bump to the top portion of the metal post; cutting the semiconductor wafer along lines delimiting the regions of the devices, after mounting the semiconductor wafer having the metal bump bonded thereto on a support member while attaching the surface on a side of the semiconductor wafer to a top of the support member, the side having the film layer formed thereon; and picking up each device while preserving a state where the film layer is attached to the top of the support member.

According to the method of manufacturing a semiconductor device of the second aspect, as in the case of the method of manufacturing a semiconductor device according to the aforementioned first aspect, wafer back grinding is performed in a relatively later stage (stage immediately after the metal post has been formed) in a wafer-level package manufacturing process. Furthermore, a film layer having heat resistance is formed on the back surface of the semiconductor wafer after the wafer back grinding has been performed and before the resist layer is removed. Accordingly, the film layer functions as a reinforcing layer against wafer cracking after the step here. Namely, almost all steps can be performed in a thick-wafer state. Accordingly, compared with the case of the aforementioned first aspect, the risk of wafer cracking can be further reduced.

Furthermore, the film layer formed on the back surface of the semiconductor wafer plays the role of planarizing the semiconductor wafer in order to prevent a warp of the semiconductor wafer from occurring when resin sealing accompanied with heat treatment is performed in a later stage. Further, the film layer is stripped off from the interface of each device in the final stage in which a pick-up process is performed, in a state where the film layer stays attached to the top of a support member. Namely, the film layer formed on the wafer back surface in order to correct warping can be finally removed, and therefore does not need to be left as a permanent film as is conventionally. As a result, the necessity of performing various kinds of reliability tests (reliability test on the adhesion to the wafer, and the like) is eliminated.

Moreover, according to a third aspect of the present invention, a method of manufacturing a semiconductor device is provided which includes the steps of: forming an insulating film on the surface on a side of a semiconductor wafer, the side having a plurality of devices formed thereon, the insulating film having an opening portion from which an electrode pad of each device is exposed; forming a conductor layer on the insulating film, the conductor layer being patterned in a required shape to cover the opening portion from which the electrode pad is exposed; forming a resist layer on the conductor layer, so as to have an opening portion from which a terminal formation portion of the conductor layer is exposed; forming a metal post on the terminal formation portion of the conductor layer with the resist layer being used as a mask; sealing a wafer surface with sealing resin, with a top portion of the metal post being exposed, after removing the resist layer; removing unnecessary sealing resin, which overflows to a wafer edge portion when the wafer surface is sealed with the sealing resin; performing thinning of the semiconductor wafer to a predetermined thickness by grinding the surface on a side thereof which is reverse to a side having the metal post formed thereon; bonding a metal bump to the top portion of the metal post; and dividing the semiconductor wafer having the metal bump bonded thereto into each device.

According to the method of manufacturing a semiconductor device of the third aspect, wafer back grinding is performed after unnecessary resin overflowing to the wafer edge portion, which occurs during a resin sealing step, has been removed. Accordingly, heretofore-unachieved wafer back grinding after a resin sealing step can be realized, without causing wafer cracking due to the resin overflow as observed in conventional technologies. As a result, almost all steps can be performed in a thick-wafer state. Accordingly, the risk of wafer cracking can be further reduced compared with the case where the manufacturing process is performed halfway in a thick-wafer state as in the aforementioned first aspect.

Moreover, according to a modified aspect of the method of manufacturing a semiconductor device of the third aspect, a method of manufacturing a semiconductor device is provided, the method comprising the steps of: forming an insulating film on the surface on a side of a semiconductor wafer, the side having a plurality of devices formed thereon, the insulating film having an opening portion from which an electrode pad of each device is exposed; forming a conductor layer on the insulating film, the conductor layer being patterned in a required shape to cover the opening portion from which the electrode pad is exposed; forming a resist layer on the conductor layer, so as to have an opening portion from which a terminal formation portion of the conductor layer is exposed; forming a metal post on the terminal formation portion of the conductor layer with the resist layer being used as a mask; forming a ring-shaped groove along a wafer edge portion on the surface on a side of the semiconductor wafer, the side having the metal post formed thereon, after removing the resist layer; sealing a wafer surface with sealing resin, with a top portion of the metal post being exposed; performing thinning of the semiconductor wafer to a predetermined thickness by grinding the surface on a side thereof which is reverse to a side having the metal post formed thereon; bonding a metal bump to the top portion of the metal post; and dividing the semiconductor wafer having the metal bump bonded thereto into each device.

According to the manufacturing method of this modified aspect, resin diffused to the peripheral portion of the semiconductor wafer during a resin sealing step can be caused to fall into a ring-shaped groove formed along the wafer edge portion. Accordingly, the resin overflow to the wafer back surface can be suppressed. As a result, as in the case of the aforementioned third aspect, heretofore-unachieved wafer back grinding after a resin sealing step can be realized without causing wafer cracking due to the resin overflow as observed in conventional technologies, and almost all steps can be performed in a thick-wafer state. According to the present aspect, the risk of wafer cracking can be further reduced.

BRIEF DESCRIPTION OF THE DRAWINGS

FIGS. 8A to 8D are cross-sectional views showing manufacturing steps (part II) subsequent to the steps of FIGS. 7A to 7C.

FIGS. 9A and 9B are cross-sectional views showing manufacturing steps (part III) subsequent to the steps of FIGS. 8A to 8D.

BEST MODE FOR CARRYING OUT THE PRESENT INVENTION

Hereinafter, embodiments of the present invention will be described with reference to the accompanying drawings.

First Embodiment

Figure 1:
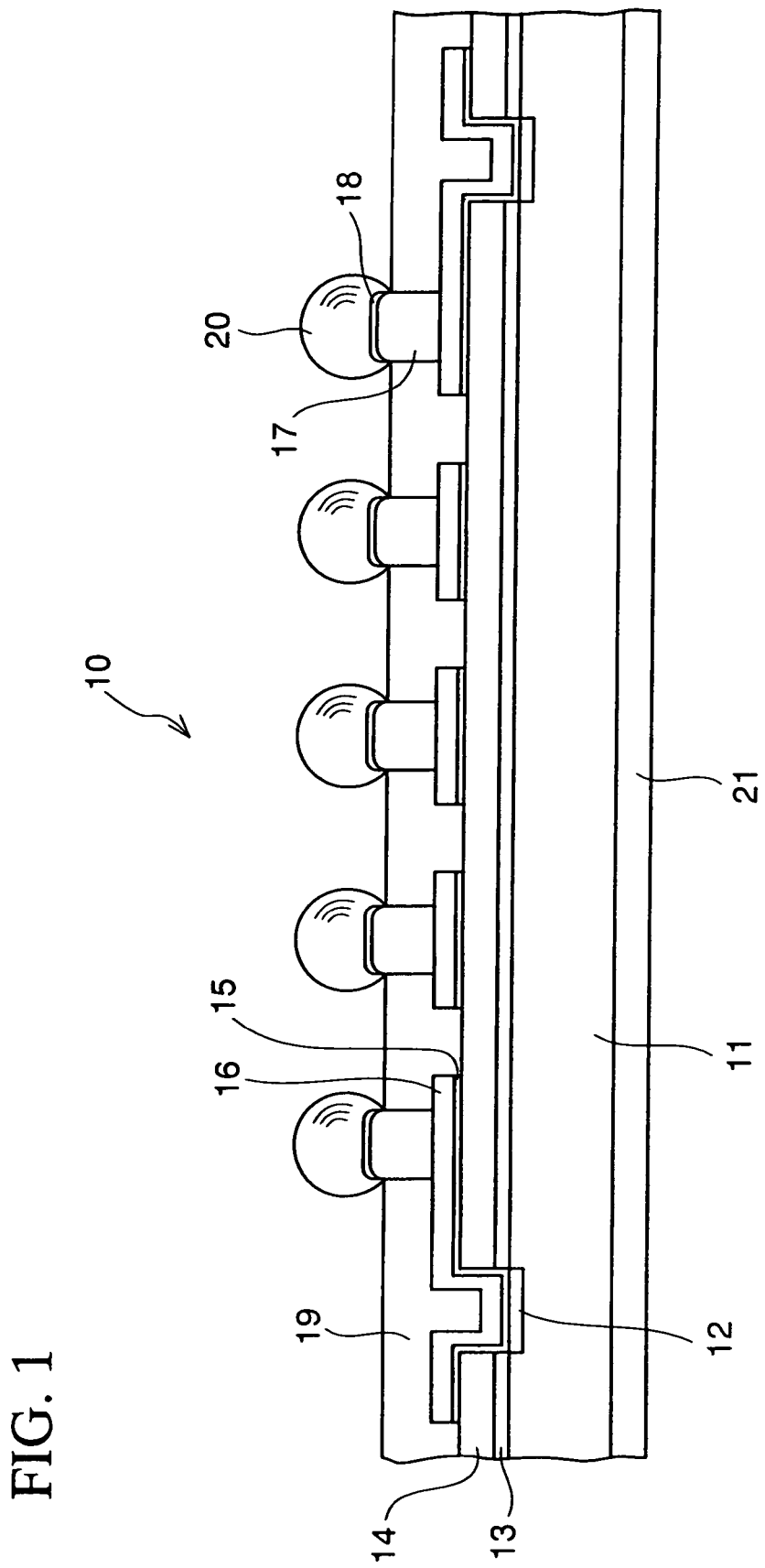
FIG. 1 is a cross-sectional view schematically showing the structure of a semiconductor device having a CSP structure according to a first embodiment of the present invention.

FIG. 1 schematically shows a cross-sectional structure of a semiconductor device having a CSP structure according to a first embodiment of the present invention.

In FIG. 1, reference numeral 10 denotes a semiconductor device (CSP) according to the embodiment, reference numeral 11 denotes a silicon (Si) substrate in which the device is formed, and the silicon substrate 11 is a portion obtained by cutting (dividing) a semiconductor (silicon) wafer described later. Further, reference numeral 12 denotes an electrode pad delimited by a partial region of a wiring pattern formed on the device; reference numeral 13 denotes a passivation film as a protective film formed on one surface (upper surface in the illustrated example) of the silicon substrate 11; reference numeral 14 denotes an insulating film (polyimide resin layer) formed on the passivation film 13; reference numeral 15 denotes a thin metal film (power-supplying layer/plated base film) formed on the insulating film 14 and patterned in a required shape to cover opening portions from which the electrode pads 12 are exposed; reference numeral 16 denotes a reroute layer formed on the thin metal film 15; reference numeral 17 denotes a metal post formed on a terminal formation portion of the reroute layer 16; reference numeral 18 denotes a barrier metal layer formed on the top portion of the metal post 17; reference numeral 19 denotes a sealing resin layer formed to cover the entire surface of the silicon substrate 11 on the side where the metal posts 17 are formed (however, the top portions of the metal posts 17 (the barrier metal layer 18) are exposed); reference numeral 20 denotes a solder bump as an external connection terminal bonded to the exposed top portion of each metal post 17 (barrier metal layer 18); and reference numeral 21 denotes a reinforcing insulating resin layer which is formed on the surface (lower surface in the illustrated example) on the other side of the silicon substrate 11 and which is for preventing wafer cracking. The material, thickness, and the like of each member are not described here, but will be appropriately explained in a manufacturing method described later.

Hereinafter, the semiconductor device 10 having a CSP structure according to the embodiment will be described with reference to FIGS. 2A to 5D which show manufacturing steps therefor in order. It is noted that each of the FIGS. 2A to 5C shows an enlarging part (part of the left side) of the cross-sectional structure shown in FIG. 1.

Figure 2A:
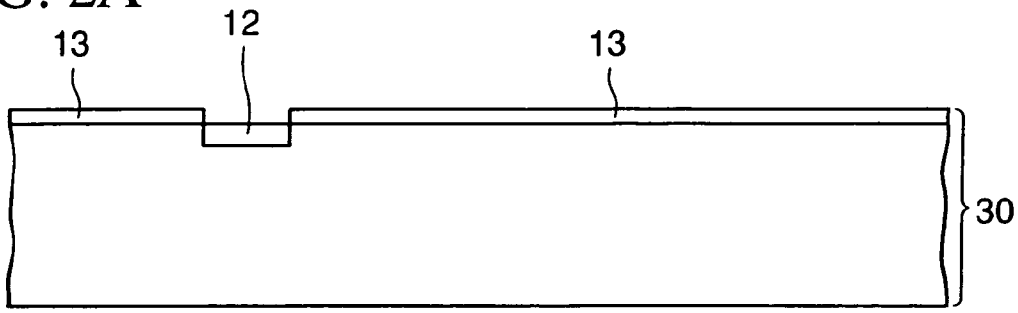
FIGS. 2A to 2D are cross-sectional views showing manufacturing steps (part I) for the semiconductor device of FIG. 1.

To begin with, in the first step (refer to FIG. 2A), a wafer 30 on which a plurality of devices are formed is prepared by a known method. Namely, a required device process is performed on a wafer having a predetermined thickness (e.g., a thickness of approximately 725 μm in the case of a wafer having a diameter of eight inches); then, the passivation film 13 as a protective film made of silicon nitride (SiN), phosphosilicate glass (PSG), or the like, is formed on one surface (upper surface in the illustrated example) of the wafer; and portions of the passivation film 13 are removed, which correspond to the electrode pads 12 delimited by partial regions of an aluminum (Al) wiring layer formed in a required pattern in each device (i.e., openings are formed in the relevant portions of the passivation film 13). The openings in the passivation film 13 are formed by laser processing using a YAG laser, an excimer laser or the like. Thus, as shown in FIG. 2A, the wafer 30 of which surface is covered with the passivation film 13 and from which the electrode pads 12 are exposed is prepared.

Figure 2B:
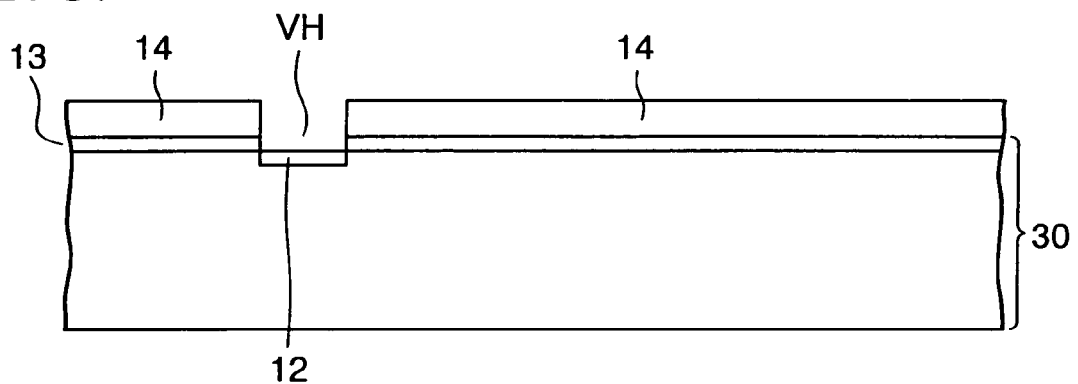
Figure 2C:
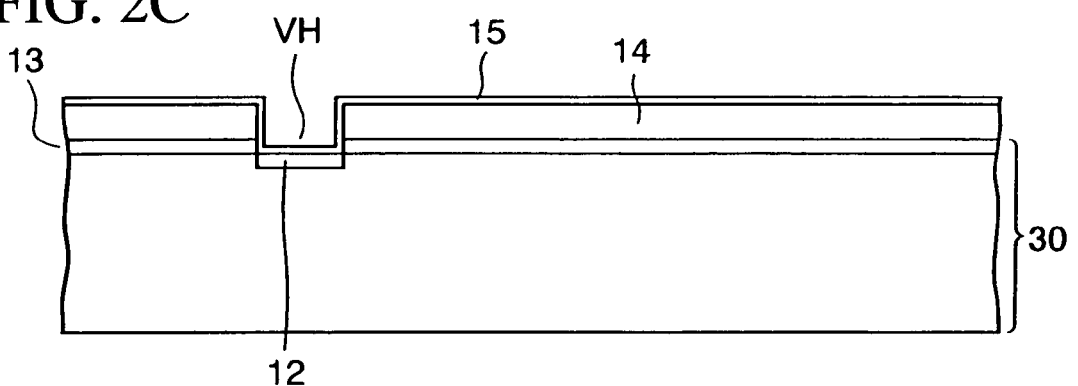
Figure 2D:
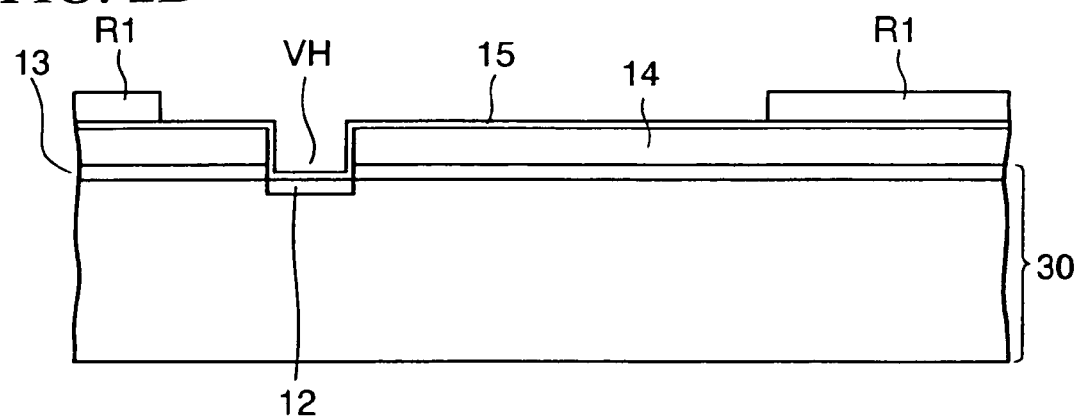
Figure 3A:
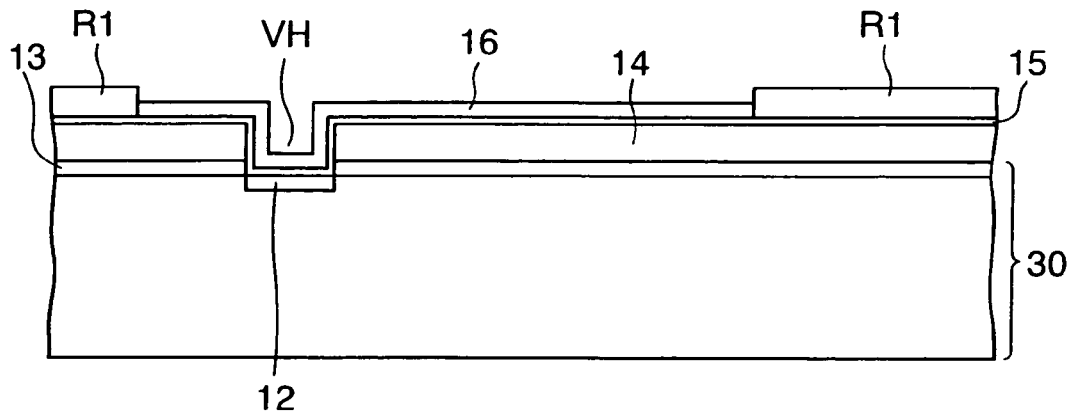
FIGS. 3A to 3C are cross-sectional views showing manufacturing steps (part II) subsequent to the steps of FIGS. 2A to 2D.
Figure 3B:
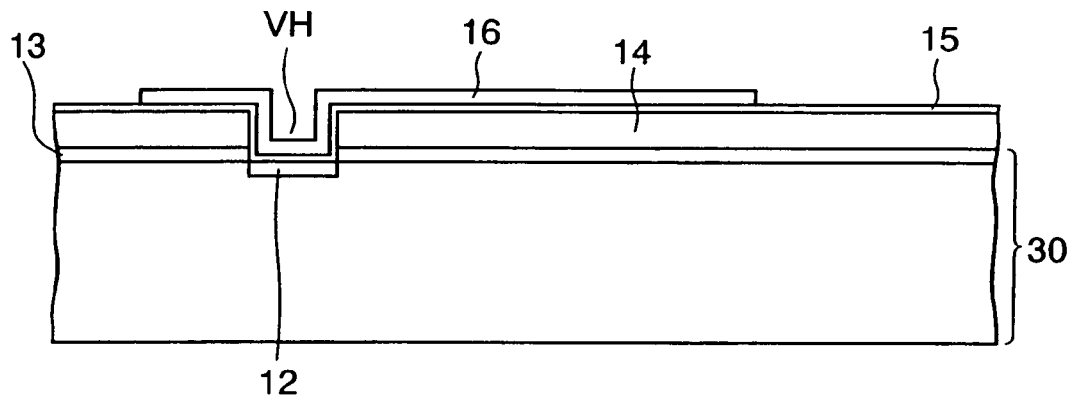
Figure 3C:
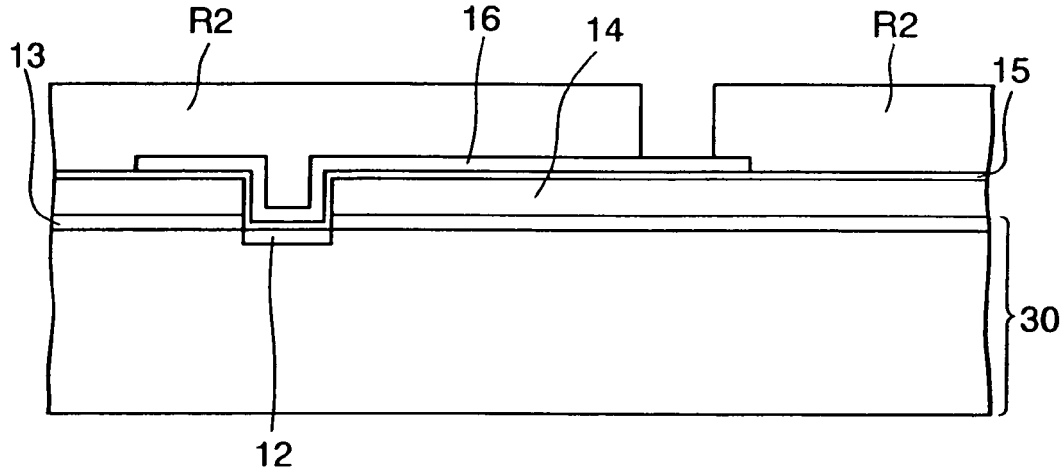

In the next step (refer to FIG. 2B), the insulating film 14 is formed on the passivation film 13 of the wafer 30. For example, by photolithography, photosensitive polyimide resin is applied to the surface of the wafer 30; a soft bake (prebake) of the polyimide resin is performed; then, exposure and development (patterning of the polyimide resin layer) are performed using a mask (not shown); and, furthermore, a hard bake (postbake) is performed. Thus the insulating film (polyimide resin layer) 14 having opening portions VH at predetermined positions is formed, as shown in FIG. 2B. In this case, the patterning of the polyimide resin layer is performed in accordance with the shape of the electrode pads 12. Accordingly, when exposure and development are performed, the polyimide resin layer 14 in the portions corresponding to the electrode pads 12 is removed as shown in FIG. 2B, whereby via holes (opening portions VH) reaching the electrode pads 12 are formed.

In the next step (refer to FIG. 2C), the thin metal film 15 is formed by sputtering on the entire surface on the side where the insulating film (polyimide resin layer) 14 is formed. The thin metal film 15 has a two-layer structure including a chromium (Cr) layer or a titanium (Ti) layer for constituting a contact metal layer, and a copper (Cu) layer stacked on the upper surface of the contact metal layer. The thin metal film 15 can be formed by depositing Cr or Ti (a contact metal layer which is Cr layer or Ti layer) on the entire surface by sputtering, and by further depositing Cu (Cu layer) thereon by sputtering. The thin metal film 15 thus formed functions as a plating base film (power-supplying layer) during the electrolytic plating which is necessary in the later steps of reroute formation and of metal post formation.

In the next step (refer to FIG. 2D), a dehydration bake of the surface (Cu layer surface) of the thin metal film 15 is performed; liquid photoresist is applied thereto and dried; and then exposure and development (patterning of the photoresist) are performed using a mask (not shown). Thus a resist layer R1 is formed. The patterning of the photoresist is performed in accordance with the shape of a reroute pattern to be formed in the next step.

In the next step (refer to FIG. 3A), the surface of the thin metal film 15 is electrolytically plated with Cu using the thin metal film 15 as a power-supplying layer, and the reroute layer (reroute pattern) 16 of Cu is formed with the patterned resist layer R1 being used as a mask.

In the next step (refer to FIG. 3B), the photoresist (resist layer R1) is stripped off and removed, for example, using a stripper containing an organic solvent.

In the next step (refer to FIG. 3C), the surface (Cu-layer surface) of the thin metal film 15 and the surface of the reroute layer 16 are cleaned; then a photosensitive dry film (approximately 100 µm in thickness) is attached thereto; and furthermore, exposure and development (patterning of the dry film) are performed using a mask (not shown). Thus a resist layer R2 is formed. The patterning of the dry film is performed in accordance with the shapes of the metal posts to be formed in the next step.

In the next step (refer to FIG. 4A), similarly, the surface of the reroute layer 16 is electrolytically plated with Cu using the thin metal film 15 as a power-supplying layer, and thus the posts (metal posts) 17 of Cu are formed on the terminal formation portions of the reroute layer 16 while using the patterned resist layer R2 as a mask. The Cu posts 17 have a height of approximately 100 µm, which is equal to the thickness of the dry film (resist layer R2).

Furthermore, the barrier metal layer 18 is formed on the top portions of the Cu posts 17 by electrolytic plating. The barrier metal layer 18 (Ni/Pd/Au) can be formed, for example, by plating the surfaces of the Cu posts 17 with nickel (Ni) for improving adhesiveness while using the Cu posts 17 as a power-supplying layer; further by plating the surface of the Ni layer with palladium (Pd) for improving conductivity; and then by plating the surface of the Pd layer with gold (Au). In this case, the Au layer may be formed directly on the Ni layer without providing the Pd layer (Ni/Au). The surface (upper surface in the illustrated example) on the side where the reroute pattern is formed is in an almost planarized state at the completion of the process described here.

In the next step (refer to FIG. 4B), the wafer back surface (lower surface in the illustrated example) is ground using a known grinding machine, and thus the thickness of the wafer 30 is reduced to a predetermined thickness (e.g., approximately 250 µm to 300 µm). In this case, since the patterned surface (upper surface) of the structure prepared in the preceding step is almost planarized, it is easy to chuck the patterned surface when the structure is held prior to grinding. Accordingly, the back surface of the wafer 30 can be ground in a chucked state as described above to a predetermined thickness as indicated by arrows in 4B.

Since the patterned surface is in an almost planarized state as described above, a patterned-surface protection tape (BG tape), such as used in conventional processes, does not need to be attached thereto when back grinding is performed. Namely, the surface of the Cu posts 17 (barrier metal layer 18) and the surface of the dry film (resist layer R2) play the role of a conventional BG tape.

In the next step (refer to FIG. 4C), the dry film (resist layer R2) is stripped off and removed using an alkaline chemical solution such as a sodium hydroxide (NaOH) based solution or a monoethanolamine based solution.

Figure 4A:
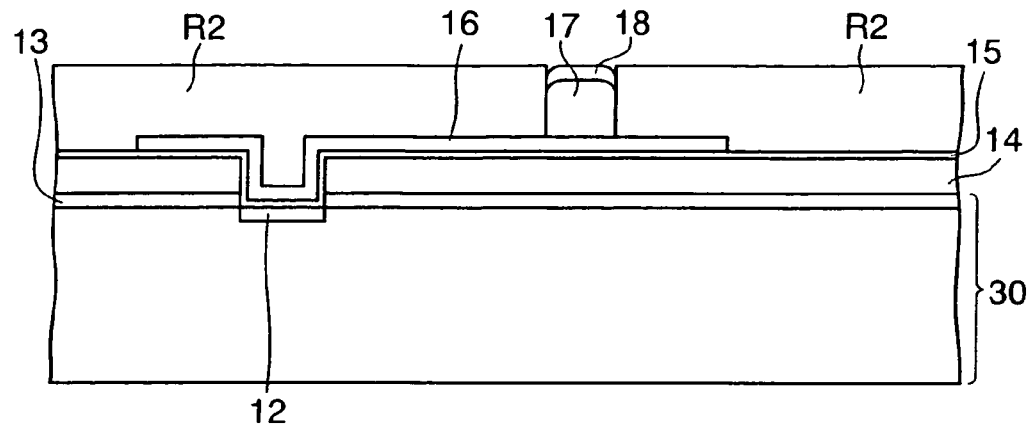
FIGS. 4A to 4D are cross-sectional views showing manufacturing steps (part III) subsequent to the steps of FIGS. 3A to 3C.

In the next step (refer to FIG. 4D), the plating base film (thin metal film 15) exposed is removed by wet etching. Namely, the Cu layer in the upper layer portion of the thin metal film 15 is removed using an etchant which dissolves Cu, and then the contact metal layer (Cr layer or Ti layer) in the lower layer portion is removed using an etchant which dissolves Cr or Ti. Thus, the insulating film (polyimide resin layer) 14 is exposed as shown in FIG. 4A. Thereafter, surface cleaning and the like are performed.

Here, when the etchant for dissolving Cu is used, it may be considered that Cu constituting the reroute layer 16 is also removed and that the reroute pattern is broken. However, there is no such harm actually. The reason is that even when Cu of the thin metal film 15 is fully removed, in the reroute layer 16 (Cu), the reroute pattern is not broken since only the surface portion thereof is removed, which is more fully explained as follows. Whereas the film thickness of the upper layer portion of the thin metal film 15 is on the order of micron or less (approximately 0.5 µm) since the upper layer portion is formed by sputtering using Cu as described above, the film thickness of the reroute layer 16 is at least approximately 10 µm because the reroute layer 16 is formed by electrolytic Cu plating.

In the next step (refer to FIG. 5A), in order to cope with unexpected wafer cracking, for reinforcement, and for correction of wafer warping after a resin sealing step, the insulating resin layer 21 is formed on the back surface of the wafer 30. As the material for the insulating resin layer 21, for example, thermosetting epoxy resin, polyimide resin, novolac resin, or solder resist is used. Coating with such resin or the like is performed and is cured, whereby the insulating resin layer 21 is formed. Alternatively, instead of using such resin or the like, a film-shaped insulating sheet member may be attached thereto.

In the next step (refer to FIG. 5B), sealing with sealing resin is performed (formation of the sealing resin layer 19) in such a manner that the entire surface of the wafer 30 on the side where the Cu posts 17 are formed is covered (however, the top portions of the Cu posts 17 (barrier metal layer 18) are exposed). The step in FIG. 5B can be performed, for example, as described below.

First, sealing dies including separate upper and lower dies are prepared and heated to a predetermined temperature (approximately 175° C.). Next, a resin film is attached to the upper die by vacuum, the wafer 30 is placed in a recessed portion of the lower die, and furthermore, highly-adhesive thermosetting resin (e.g., epoxy resin) shaped in a tablet from is mounted as sealing resin on the wafer 30. Then, the thermosetting resin is melted by the heat of the sealing dies and the pressure of a press to be spread over the entire wafer surface (in approximately three minutes), and thereafter, the wafer 30 is taken out of the dies. Further, the process (cure) of curing the thermosetting resin is performed (within a range of approximately 1 hour to 12 hours). Since the wafer 30 has been integrated with the resin film, the resin film is stripped off from the wafer 30. Thus, as shown in the drawing, the wafer 30 of which surface is covered with the sealing resin layer 19 and from which the top portions of the Cu posts 17 (barrier metal layer 18) are exposed is prepared.

In the next step (refer to FIG. 5C), after flux as a surface treatment agent is applied to the exposed top portions of the Cu posts 17 (barrier metal layer 18), solder used as an external connection terminal is formed by printing or ball mounting, and then the solder is fixed by reflow at a temperature of approximately 240° C. to 260° C. (bonding of the solder bumps 20). Thereafter, the surface is cleaned to remove the flux.

In the final step (refer to FIG. 5D), after the wafer 30 (including the insulating film 14, the sealing resin layer 19, and the insulating resin layer 21) to which the solder bumps 20 have been bonded in the preceding step is mounted on a support member (not shown) for dicing, the wafer 30 is cut by a dicer or the like (blade BL of a dicer in the illustrated example) to be divided into individual semiconductor chips (devices). Thus, the semiconductor device 10 (FIG. 1) having a CSP structure according to the first embodiment is prepared.

As described above, according to the method of manufacturing the semiconductor device 10 having a CSP structure of the first embodiment, the back grinding of the wafer 30 is performed (refer to FIG. 4B) in a relatively later stage (stage immediately after the Cu posts 17 and the barrier metal layer 18 have been formed) in the wafer-level package manufacturing process, and, up to the step of forming the Cu posts 17 and the barrier metal layer 18 (refer to FIGS. 2A to 4A), the processes can be performed in a state where the wafer 30 is thick (in the case here, a thick-wafer state of approximately 725 μm). Accordingly, when the thinning of a wafer-level package is realized, it is possible to prevent the occurrence of "wafer cracking" observed in conventional technologies.

Further, at the time immediately before the back grinding of the wafer 30 is performed (refer to FIG. 4A), the wafer surface (surface on the side where a pattern is formed) is in an almost planarized state, by means of the surface of the Cu posts 17 (barrier metal layer 18) and the surface of the dry film (resist layer R2). Accordingly, when wafer back grinding is performed, an expensive BG tape of a thick film type used in conventional processes, does not need to be attached thereto. As a result, the necessity of a dedicated laminator and a dedicated remover (including a removal tape) is also completely eliminated. Consequently, it becomes possible to reduce the manufacturing cost.

In the above-described embodiment, the back grinding of the wafer 30 is performed after the Cu posts 17 and the barrier metal layer 18 have been formed by electrolytic plating (before the dry film R2 is stripped off). However, it is a matter of course that the timing of back grinding is not limited to the stage as described above. As apparent from the spirit of the present invention, it is required only that the timing of back grinding be in a stage in which the surface is in an almost planarized state immediately before the back grinding of the wafer 30 is performed, and which is as late as possible in the wafer-level package manufacturing process. In consideration of these requirements, for example, the back grinding of the wafer 30 may be performed in the stage (refer to FIG. 3A) after the formation of the reroute layer 16 (before the stripping of the photoresist R1).

Further, according to the aforementioned embodiment, in the step of FIG. 2A, the passivation film 13 as a protective film is provided on one surface of the wafer. In some cases, however, the function of a passivation film is imparted to the insulating film (polyimide resin layer) 14 formed in the subsequent step (step of FIG. 2B) without providing the passivation film 13. Alternatively, in contrast, it is also possible to provide only the passivation film 13 without providing the insulating film 14.

Further, in the aforementioned embodiment, the description has been made for the case where photosensitive polyimide resin is used as the insulating film 14 formed on the surface of the wafer 30 in the step of FIG. 2B. However, it is a matter of course that the material for the insulating film is not limited to photosensitive resin. For example, resin such as non-photosensitive polyimide resin or epoxy resin may be used.

Figure 5A:
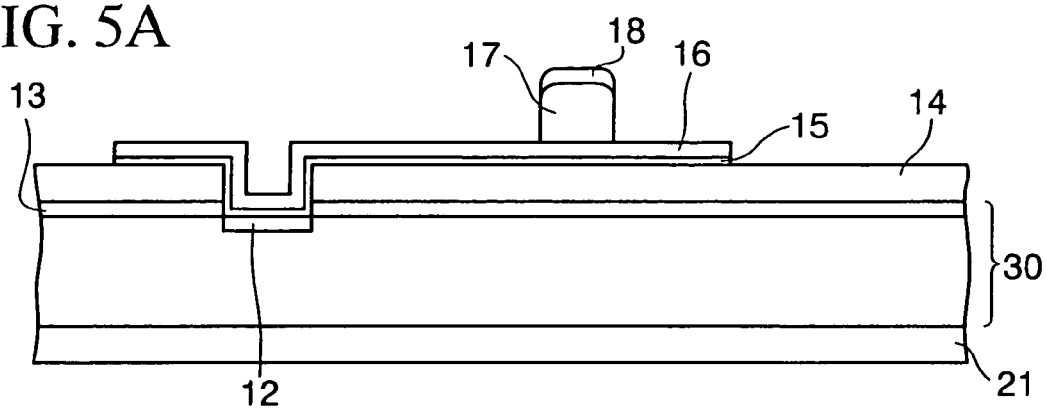
FIGS. 5A to 5C are cross-sectional views and FIG. 5D is a perspective view, showing manufacturing steps (part IV) subsequent to the steps of FIGS. 4A to 4D.

Further, in the aforementioned embodiment, the insulating resin layer 21 for reinforcement and wafer warping correction is formed on the wafer back surface in the step of FIG. 5A in order to cope with unexpected wafer cracking. However, the insulating resin layer 21 does not necessarily need to be formed. In some cases, the step may be omitted.

Second Embodiment

Figure 6:
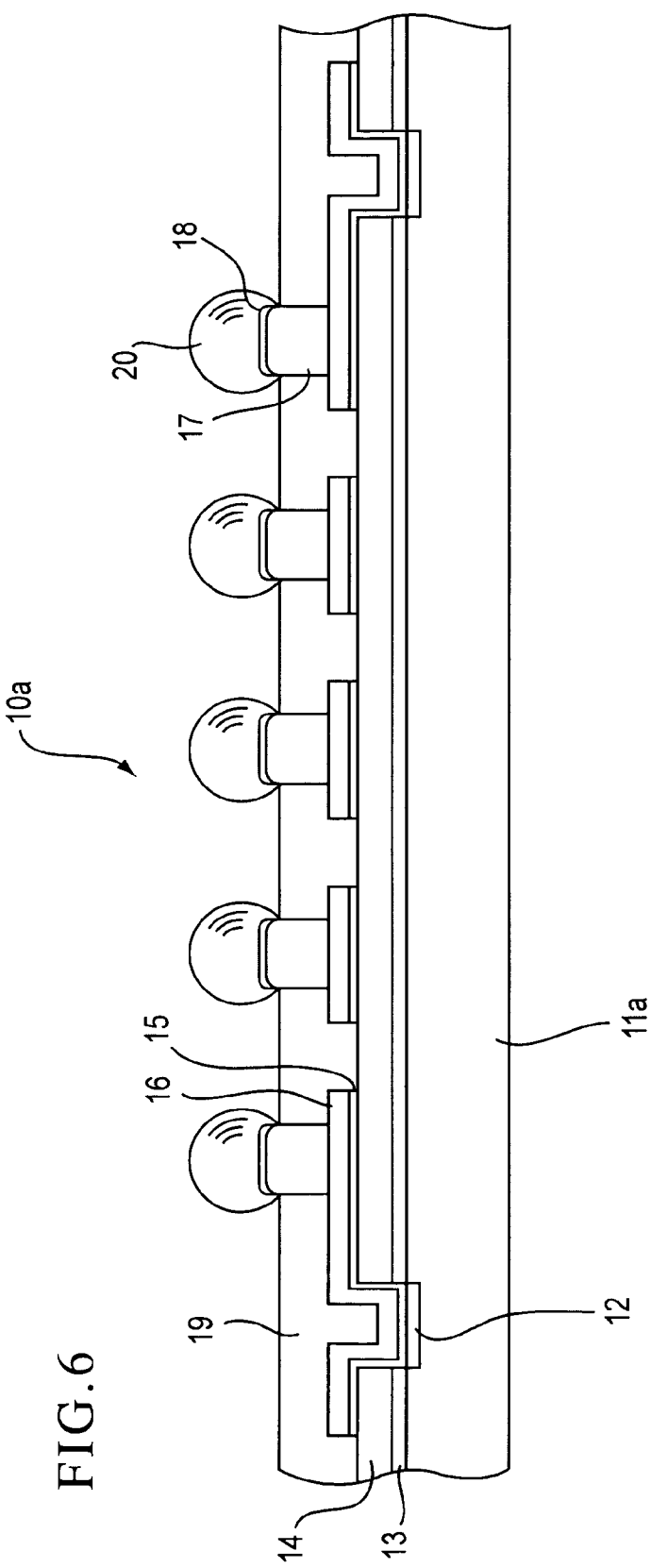
FIG. 6 is a cross-sectional view schematically showing the structure of a semiconductor device having a CSP structure according to a second embodiment of the present invention.

FIG. 6 schematically shows a cross-sectional structure of a semiconductor device having a CSP structure according to a second embodiment of the present invention.

As shown in FIG. 6, a semiconductor device 10a according to the second embodiment differs from the semiconductor device 10 (FIG. 1) according to the aforementioned first embodiment in that the back surface of a silicon substrate 11a is exposed. As described above, in the first embodiment, the reinforcing insulating resin layer 21, which is formed on the wafer back surface in order to cope with unexpected wafer cracking during the wafer-level package manufacturing process, is left as deposited up to the completion of the process (refer to FIGS. 5A to 5D), and the semiconductor device 10 is thus obtained. On the other hand, in the second embodiment, while a film layer as a countermeasure against wafer cracking is formed on the wafer back surface during the manufacturing process as in the first embodiment, the film layer is stripped off and removed from the wafer back surface (back surface of a silicon substrate 11a) in the final stage of the manufacturing process as described hereinbelow. As a result, the back surface of the silicon substrate 11a is exposed as shown in FIG. 6. Other components of the semiconductor device 10a according to the second embodiment are basically the same as those (FIG. 1) according to the first embodiment, and therefore will not be further described.

The film layer formed on the wafer back surface during the manufacturing process has the function of preventing the occurrence of wafer warping (function of correcting wafer warping) when heat treatment such as the thermal cure of the sealing resin is performed, as well as the function of reinforcement for preventing wafer cracking. The material, thickness, shape, and the like of the film layer will be appropriately described in the manufacturing process described hereinbelow.

Hereinafter, the semiconductor device 10a having a CSP structure according to the second embodiment will be described with reference to FIGS. 7A to 9B which show manufacturing steps therefor in order. It is noted that the cross-sectional structure shown in each drawing is shown by enlarging part (part of the left side) of the cross-sectional structure shown in FIG. 6.

First, as in the process performed in the steps of FIGS. 2A to 4A, a wafer 30a of which surface is covered with a passivation film 13 and from which electrode pads 12 are exposed is prepared; an insulating film (polyimide resin layer) 14 is formed on the passivation film 13; a thin metal film 15 is formed on the electrode pads 12 and the insulating film 14; a reroute layer 16 of Cu is formed on the surface of the thin metal film 15 using the thin metal film 15 as a power-supplying layer; and Cu posts (metal posts) 17 and the barrier metal layer 18 are formed on the terminal formation portions of the reroute layer 16 using a patterned dry film (resist layer R2) as a mask.

Figure 4B:
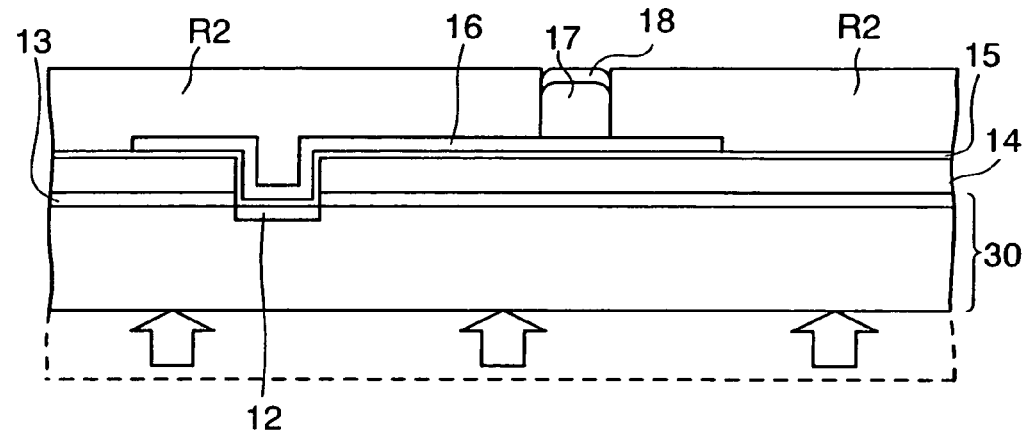

In the next step (refer to FIG. 7A), as in the process performed in the step of FIG. 4B, the wafer back surface is ground using a grinding machine, and thus the thickness of the wafer 30a is reduced to a predetermined thickness (e.g., approximately 200 µm).

In the next step (refer to FIG. 7B), marking is performed using a $CO_2$ laser, on the back surface of the thinned wafer 30a. Namely, information containing a serial number, the client company name, and the like, is written into each device.

In the next step (refer to FIG. 7C), in order to cope with wafer cracking and wafer warping, a film layer 22 having a predetermined thickness (e.g., approximately 70 to 290 µm) is formed on the back surface of the wafer 30a. In the second embodiment, as the film layer 22, a tape having heat resistance (approximately 240° C. at the maximum) and chemical agent resistance (for convenience, hereinafter, such a tape will be referred to as a "heat-resistant tape") is used. Preferably, a highly heat-resistant PET (polyester)-based tape used in a die-attach-film (DAF) process is used. The heat-resistant tape 22 has a multilayer structure in which an adhesive or the like is applied to the top of a base material such as a PET film, and is attached to the back surface of the wafer 30a with the adhesive layer interposed therebetween.

In the second embodiment, as the heat-resistant tape 22, a tape having the property of curing in response to ultraviolet (UV) irradiation (i.e., a tape of a type which is peeled off by UV irradiation) is used. Here, the reasons why the heat-resistant tape 22 requires "chemical agent resistance" are that, since it is needed to use an alkaline chemical solution for stripping off the dry film (resist layer R2) in a later step and to further use an acidic or alkaline etchant for removing the exposed plating base film (thin metal film 15), resistance to these chemical solutions is required.

Figure 4C:
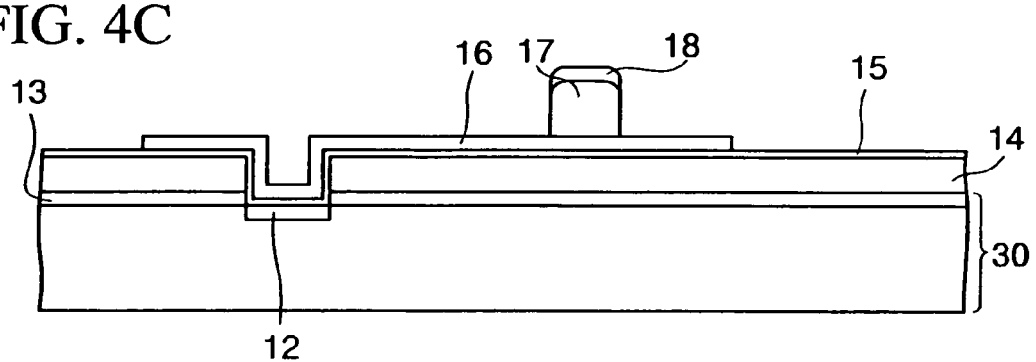
Figure 4D:
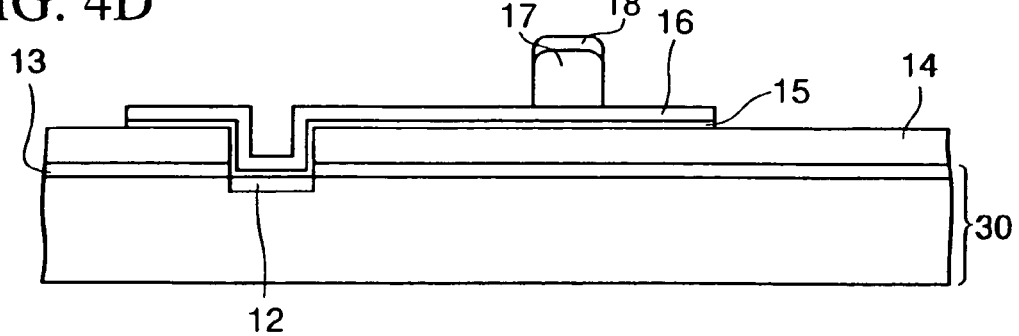

In the next step (refer to FIG. 8A), as in the process performed in the steps of FIGS. 4C and 4D, the dry film (resist layer R2) is stripped off, and the exposed plating base film (thin metal film 15) is removed.

In the next step (refer to FIG. 8B), ultraviolet (UV) light is applied to the heat-resistant tape 22 attached to the back surface of the wafer 30a. The dose of the UV irradiation is set to a dose which is sufficient to cure the adhesive layer composing the heat-resistant tape 22 to a certain extent, but which is not excessive. The reason why UV irradiation is performed in this stage will be described hereinbelow.

Figure 5B:
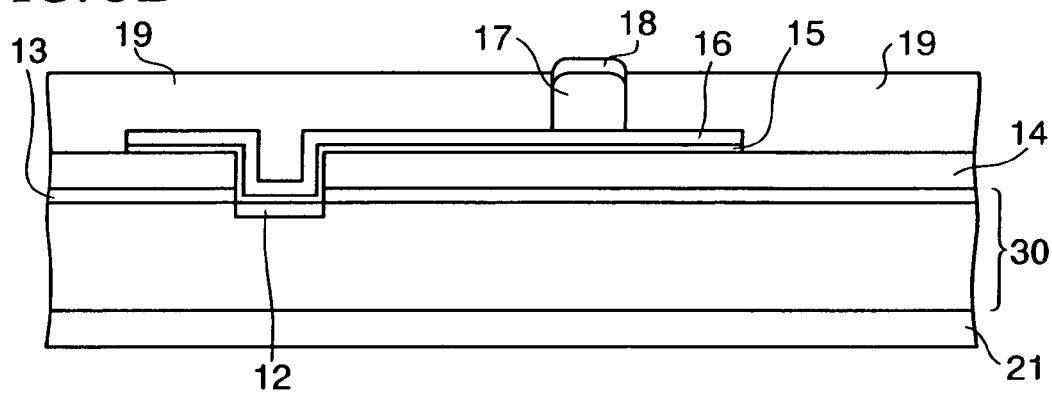

In the next step (refer to FIG. 8C), as in the process performed in the step of FIG. 5B, sealing with sealing resin is performed in such a manner that the entire surface of the wafer 30 on the side where the Cu posts 17 are formed is covered (however, the top portions of the Cu posts 17 (barrier metal layer 18) are exposed).

Figure 5C:
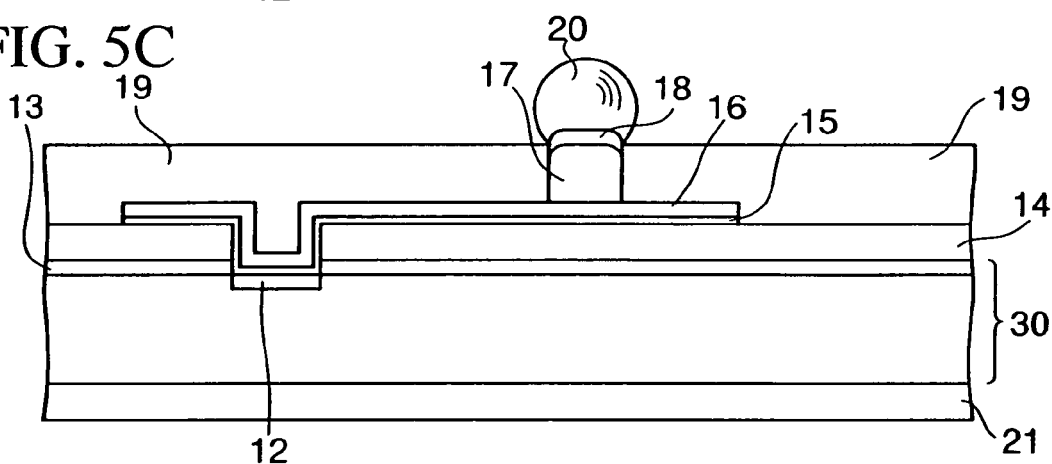
Figure 5D:
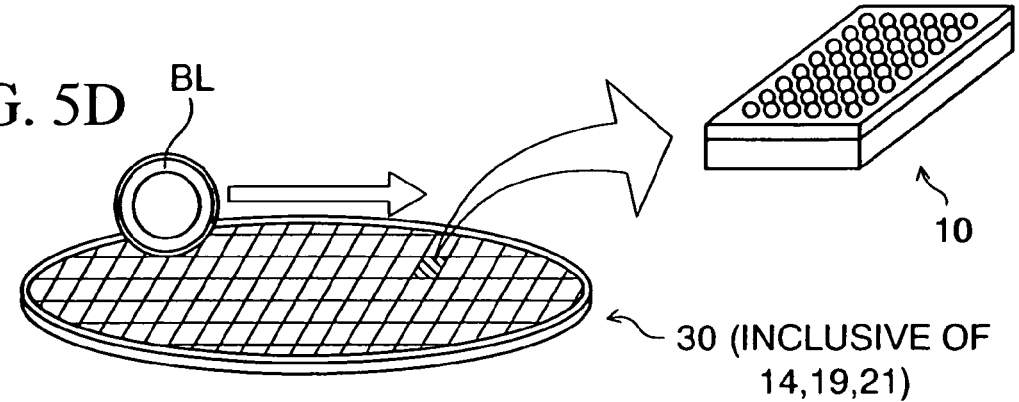

In the next step (refer to FIG. 8D), as in the process performed in the step of FIG. 5C, the bonding of the external connection terminal (solder bump 20) is performed.

In the next step (refer to FIG. 9A), the semiconductor wafer 30a to which the solder bumps 20 are bonded is mounted on a dicing tape 41 supported by a dicing frame 40, in such a manner that the surface of the semiconductor wafer 30a to which the heat-resistant tape 22 is attached is attached to the dicing tape 41. Further, the semiconductor wafer 30a is cut along lines delimiting the regions of devices using a dicer or the like (in the illustrated example, a blade BL of a dicer). In the present case, as indicated by dashed-lines in FIG. 9A, incisions are made partially in the thickness of the heat-resistant tape 22. Thus, the semiconductor wafer 30a is divided into individual semiconductor chips (devices) in a state where the heat-resistant tape 22 is attached thereto.

In the last step (refer to FIG. 9B), each semiconductor chip (device) 10a cut and divided in the preceding step is picked up. Here, the heat-resistance tape 22 attached to the back surface of the semiconductor wafer 30a is completely stripped off from the wafer back surface in a state where the heat-resistant tape 22 stays attached to the top of the dicing tape 41, because UV irradiation (FIG. 8B) has been performed on the heat-resistant tape 22 in advance.

Namely, the heat-resistant tape 22 has a multilayered structure as described above, in which an adhesive or the like is applied to the top of a base material (PET film); when a pick-up process is finally performed, part of the adhesive layer is stuck to the wafer back surface at the time of picking up, and thus the heat-resistant tape 22 cannot be neatly stripped off, since the adhesive layer deteriorates if heat treatment such as cure (FIG. 8C) and reflow (FIG. 8D) is performed before UV irradiation, while there is no problem if the adhesive layer is peeled off from the wafer back surface in a state where the adhesive layer is completely attached to the base material. According to the second embodiment, the heat-resistant tape 22 can be neatly stripped off from the wafer back surface in a state where the adhesive layer is completely attached to the base material when the pick-up process is finally performed, by performing UV irradiation to cure the adhesive layer to a certain extent in a stage before heat treatment is performed. However, if the dose of UV irradiation is excessive, the heat-resistant tape 22 may be peeled off in a stage before the pick-up process due to some shock or the like. Accordingly, it is necessary that the dose of UV irradiation need to be appropriately set as described above.

As described above, according to the method of manufacturing the semiconductor device 10a having a CSP structure of the second embodiment, the back grinding of the wafer 30a is performed (refer to FIG. 7A) in a relatively later stage (stage immediately after the Cu posts 17 and the barrier metal layer 18 have been formed) in the wafer-level package manufacturing process, as in the case of the aforementioned first embodiment. Furthermore, the heat-resistant tape 22 having a predetermined thickness is attached to the back surface of the wafer 30a (refer to FIG. 7C) after the wafer back grinding process has been performed, and before the stripping of the dry film (resist layer R2) and the etching removal of the plating base film (thin metal film 15) are performed. Accordingly, after the step, the heat-resistant tape 22 functions as a reinforcing film layer against wafer cracking.

Figure 7A:
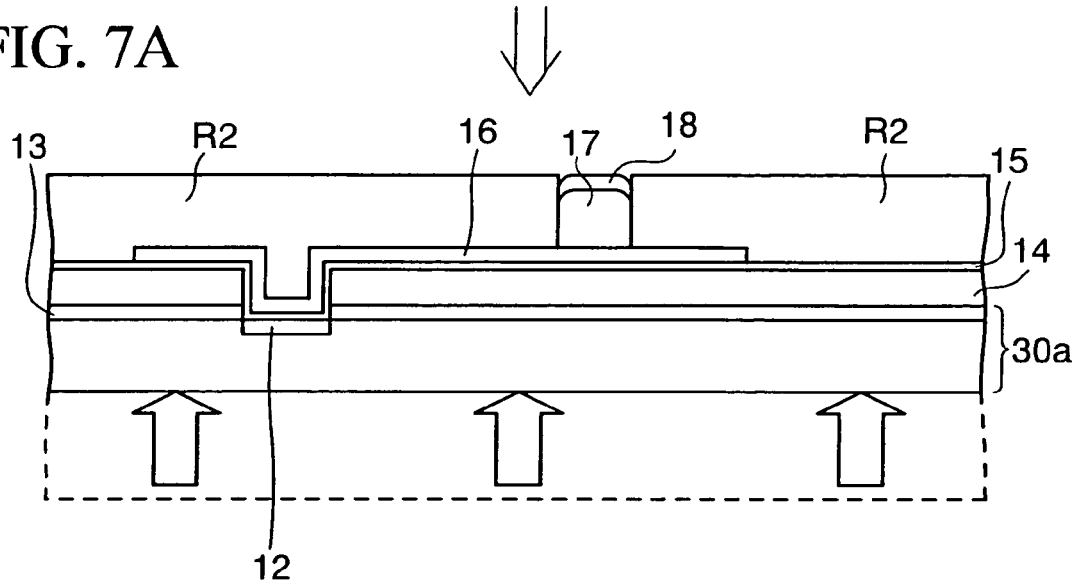
FIGS. 7A to 7C are cross-sectional views showing manufacturing steps (part I) for the semiconductor device of FIG. 6.
Figure 7B:
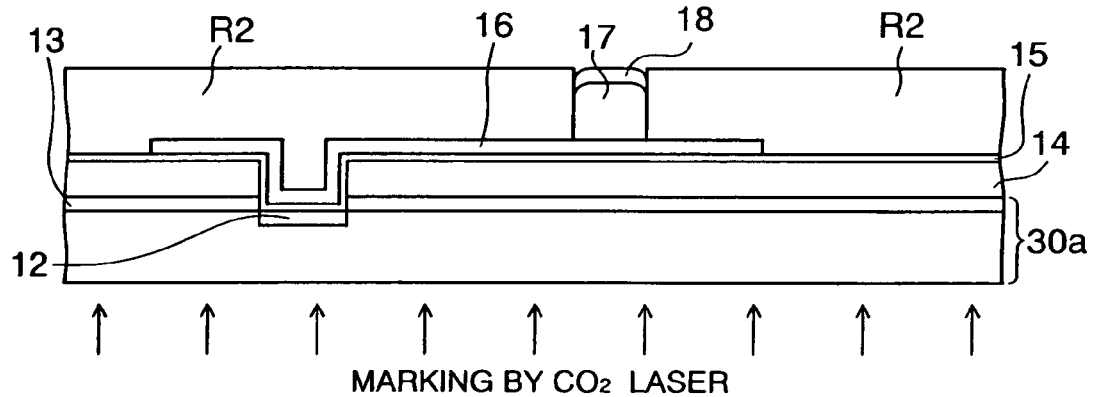
Figure 7C:
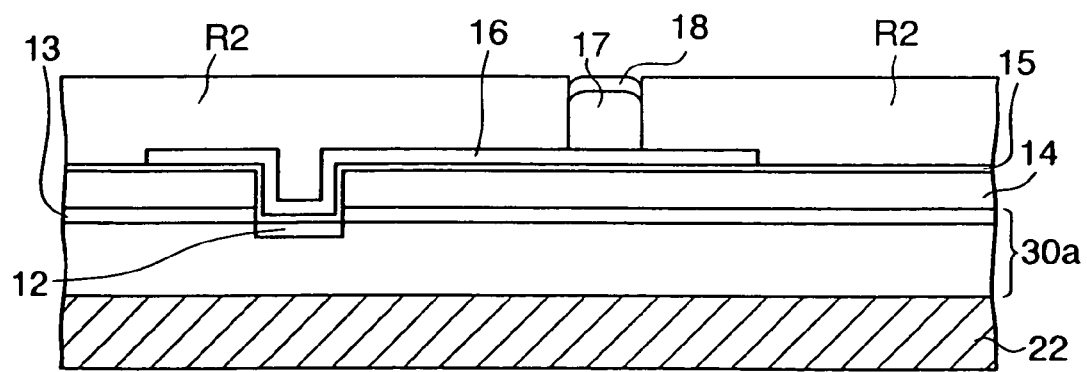

Namely, according to the second embodiment, all steps except the step of FIG. 7B (marking using a $CO_2$ laser) can be performed in a thick-wafer state. Accordingly, compared with the case of the aforementioned first embodiment, the risk of wafer cracking can be further reduced.

Further, the heat-resistant tape 22 attached to the back surface of the wafer 30a can planarize the wafer 30a in order to prevent the occurrence of the warping of the wafer 30a when resin sealing or heat treatment such as thermosetting (cure) is performed in a later step, and can be completely stripped off from the wafer back surface in the final stage in which the pick-up process is performed (FIG. 9B). Namely, the heat-resistant tape 22, which is attached to the wafer back surface in order to correct warping, can be finally removed, and therefore does not need to be left as a permanent film as heretofore. As a result, the necessity of performing various kinds of reliability tests (reliability test on the adhesion to the wafer, and the like) is eliminated, and problems such as delamination between a permanent film (film layer) and a chip back surface do not occur.

In the aforementioned second embodiment, the description has been made by taking as an example the case where, as the form employed for the heat-resistant tape 22, a heat-resistant tape of a type (so-called "UV release type") which is stripped off after UV irradiation is applied. However, it is a matter of course that the form of a heat-resistant tape to be used is not limited to the aforementioned form. For example, a heat-resistant tape of a type (so-called "heat release type") which is stripped off by heating, instead of UV irradiation, may be used, because of the merit of being inexpensive compared with the UV release type.

In a heat release-type tape, the adhesion is reduced by applying heat of, for example, approximately 50° C. to 60° C. The heat release-type tape can be stripped off by further applying a stripping force. Here, it should be noted that the stripping cannot be performed only by simply applying heat. Namely, while cure (FIG. 8C) is performed at a higher temperature of approximately 175° C., and furthermore, reflow (FIG. 8D) is performed at a temperature of approximately 240° C. to 260° C. in the stages after the heat release-type tape is attached, peeling off of the relevant tape does not occur depending only on temperature conditions thereof; and the relevant tape can be stripped off from the wafer back surface by applying a force which strips each device from the relevant tape, as well as by heating the relevant tape (heat release-type tape) attached to the wafer to a predetermined temperature (approximately 50° C. to 60° C.), in the final stage (FIG. 9B) in which the pick-up process is performed. To this end, a heating mechanism for heating the relevant tape to the predetermined temperature is necessary in the stage of the pick-up process.

Third Embodiment

As described above, in order to avoid wafer cracking caused by a process in a thin-wafer state, it is desirable that a wafer back grinding process be performed in a stage which is as late as possible. However, for example, in the case where the wafer back grinding process is performed after resin sealing, as described in connection with problems of conventional technologies, wafer cracking due to an overflow of molding resin may be occur. FIGS. 10A to 11B show a method of eliminating such a disadvantage.

Figure 10A:
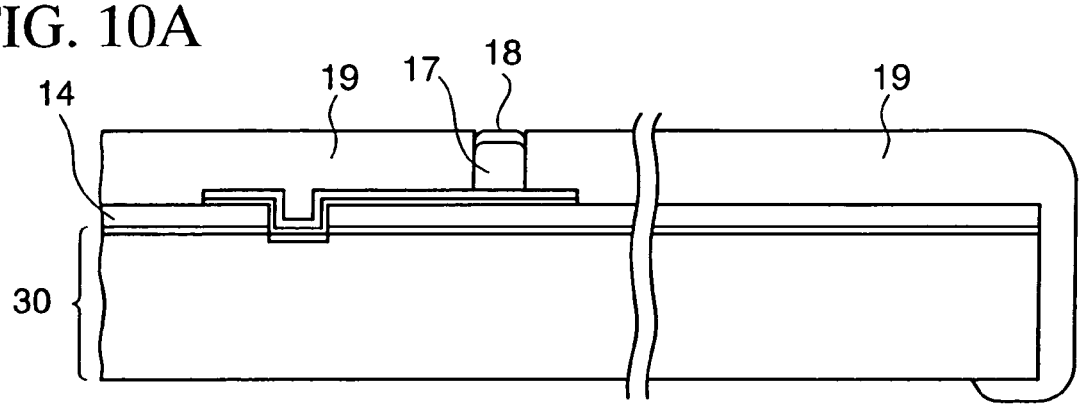
FIGS. 10A to 10C are cross-sectional view showing part of manufacturing steps for a semiconductor device according to a third embodiment of the present invention.
Figure 10B:
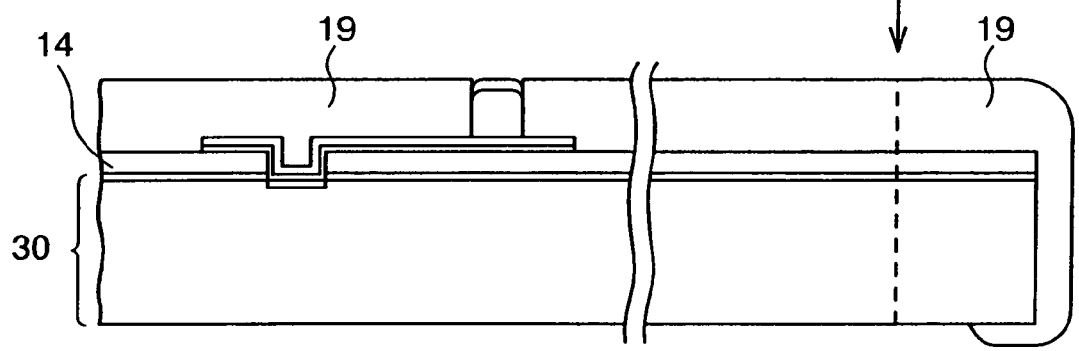
Figure 10C:
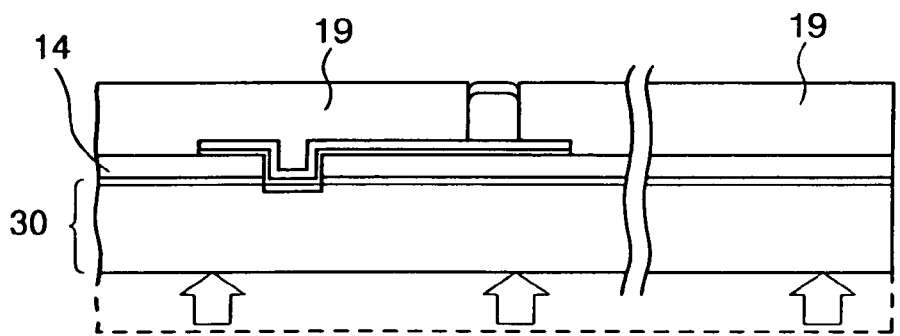
Figure 11A:
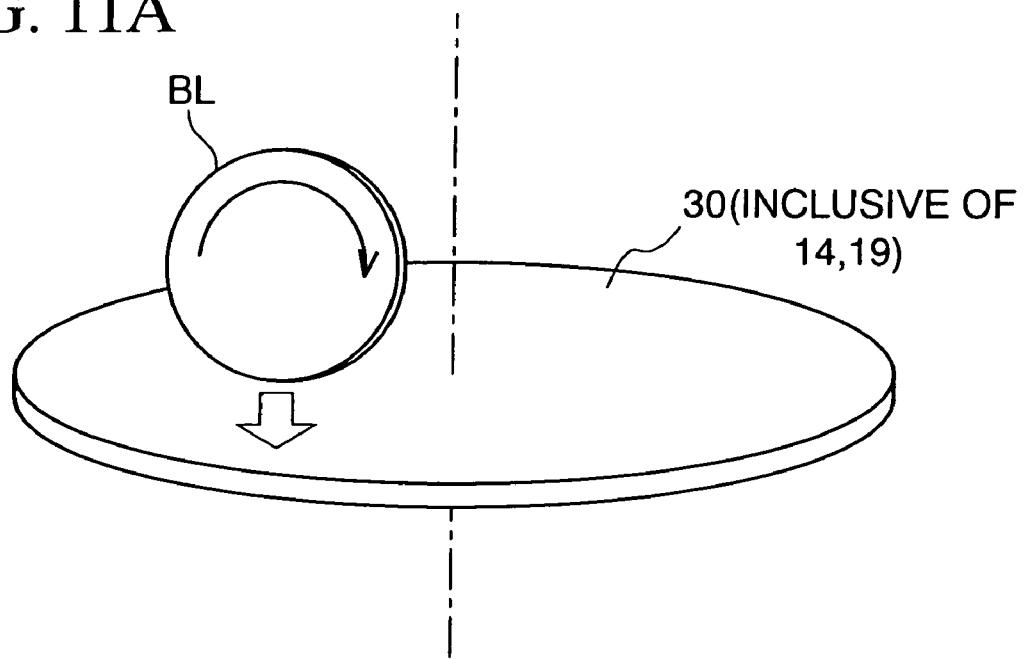
FIGS. 11A and 11B are diagrams for explaining a machining process performed on a wafer edge portion in the step of FIG. 10B.
Figure 11B:
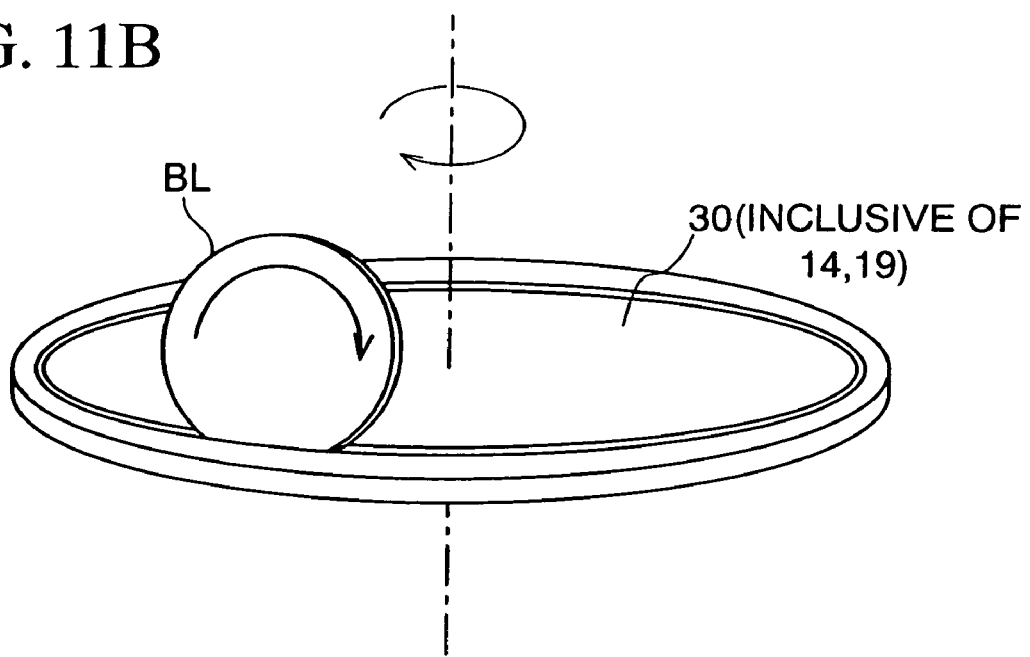

FIGS. 10A to 10C show part of a process of manufacturing a semiconductor device according to a third embodiment of the present invention, and FIGS. 11A and 11B are diagrams for explaining a machining process performed on a wafer edge portion in the step of FIG. 10B.

Prior to the steps shown in FIGS. 10A to 10C, first, a process which is almost the same as performed in the steps of FIGS. 2A to 5A is performed. However, a wafer back grinding process (FIG. 4B) and the process (FIG. 5A) of forming an insulating resin layer 21 are excluded. Then, in the step of FIG. 10A, as in the process performed in the step of FIG. 5B, sealing with sealing resin is performed in such a manner that the entire surface on a side of the wafer 30, on which the Cu posts 17 are formed, is covered (however, the top portions of the Cu posts 17 (barrier metal layer 18) are exposed). Here, the resin (19) is diffused to the peripheral portion of the wafer 30 as shown in FIG. 10A. The diffused resin overflows to the wafer edge portion to reach the wafer back surface. If the wafer back grinding process is performed in such a state as described here, wafer cracking may occur as described above.

Accordingly, in the next step (refer to FIG. 10B), unnecessary resin overflowing to the wafer edge portion is cut (removed) by circular cut machining (also referred to as "circular dicing method") using a dicer (blade BL). Specifically, as shown in FIGS. 11A and 11B, first, the blade BL is lowered (refer to FIG. 11A) to a position which is at an offset of a predetermined radial portion from the center of the wafer 30, and a chuck table (not shown) to which the wafer 30 is attached by vacuum is rotated (refer to FIG. 11B) with the height of the blade BL fixed, whereby a portion of the wafer 30 at the relevant position can be cut. Thus, the unnecessary resin layer 19 in the wafer edge portion is removed.

In the next step (refer to FIG. 10C) after the unnecessary resin layer 19 overflowed to the wafer edge portion has been removed, as in the process performed in the step of FIG. 4B, the wafer back surface is ground using a grinding machine, and thus the wafer 30 is thinned to a predetermined thickness. Thereafter, although not particularly shown, the solder bumps 20 are bonded to the exposed top portions of the Cu posts 17 (barrier metal layer 18), and the wafer 30 (including the insulating film 14 and the sealing resin layer 19) is diced to be divided into individual semiconductor chips (devices).

As described above, according to the method of manufacturing the semiconductor device of the third embodiment, a heretofore-unachieved wafer back grinding process after a resin sealing step can be realized, with the reason being that wafer cracking due to the resin overflow observed in conventional technologies can be avoided since the wafer back grinding process is performed after removing the unnecessary resin layer 19 which has overflowed to the wafer edge portion when resin sealing has been performed in a stage close to the final stage in the wafer-level package manufacturing process. As a result, almost all steps can be performed in a thick-wafer state, and accordingly, the risk of wafer cracking can be further reduced compared with a case such as in the first embodiment where the manufacturing process is performed halfway in a thick-wafer state.

Figure 12A:
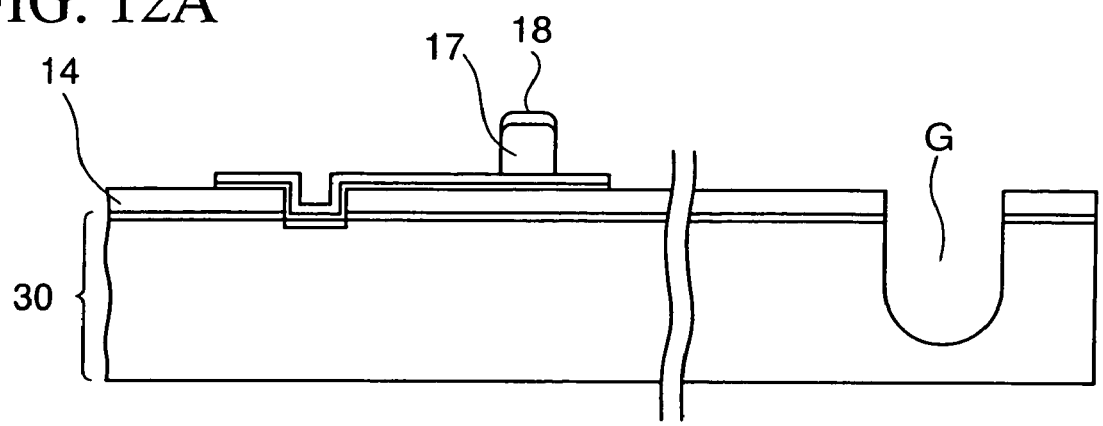
FIGS. 12A and 12B are cross-sectional views showing part of manufacturing steps according to a modification of the embodiment shown in FIGS. 10A to 10C.
Figure 12B:
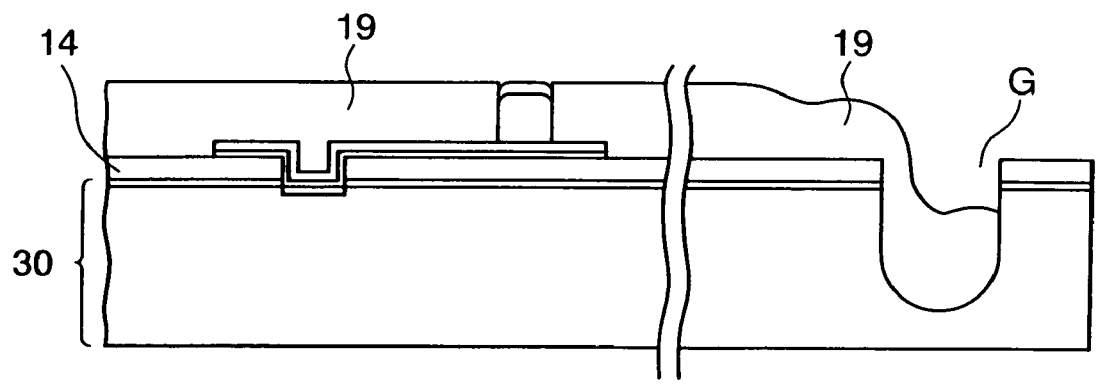

In the aforementioned third embodiment, as a method of eliminating the problem in that the resin overflow occurs on the wafer edge portion when resin sealing is performed prior to the wafer back grinding process, the description has been made by taking as an example a method in which the unnecessary resin layer 19 overflowing is cut (removed). However, it is a matter of course that a method of eliminating the problem of the resin overflow on the wafer edge portion is not limited to the method in the description. For example, it is also possible to adopt a method in which resin diffused to the peripheral portion of the wafer stays on the wafer edge portion during resin sealing so that the resin is prevented from reaching the wafer back surface. FIGS. 12A and 12B illustrate a method for the case as described here.

In the method shown in FIGS. 12A and 12B, first, a process similar to that performed in the steps of FIGS. 2A to 5A is performed prior to the process shown in FIGS. 12A and 12B. Note, a wafer back grinding process (FIG. 4B) and a process (FIG. 5A) of forming an insulating resin layer 21 are excluded. Then, in the step of FIG. 12A, a U-shaped groove G is formed in the form of a ring along the wafer edge portion on the surface of the wafer 30 on the side on which the Cu posts 17 (barrier metal layer 18) are formed. The U-shaped groove G can be formed by combining circular dicing as illustrated in FIGS. 11A and 11B and profile processing which is performed by utilizing the shape of the blade BL of the dicer. Although a U-shaped groove G is adopted in the illustrated example, it is a matter of course that the cross-sectional shape of a groove to be formed is not limited to a "U-shape." For example, a V-shape, a rectangular shape, or other shapes may be adopted.

After the U-shaped groove G has been formed in the wafer edge portion as described above, in the next step (refer to FIG. 12B), as in the process performed in the step of FIG. 5B, sealing with the sealing resin 19 is performed in such a manner that the entire surface of the wafer 30 on the side, on which the Cu posts 17 are formed, is covered (however, the top portions of the Cu posts 17 (barrier metal layer 18) are exposed). At this time, the resin 19 diffused to the peripheral portion of the wafer 30 as shown in FIG. 12B is allowed to fall into the U-shaped groove G formed in the wafer edge portion. Thereafter, although not particularly shown, the wafer 30 is thinned to a predetermined thickness by grinding the wafer back surface using a grinding machine, and the solder bumps 20 are bonded to the exposed top portions of the Cu posts 17 (barrier metal layer 18). Then, the wafer 30 (including the insulating film 14 and the sealing resin layer 19) is diced to be divided into individual semiconductor chips (devices).

As described above, according to the embodiment shown in FIGS. 12A and 12B, the resin overflowing to the wafer back surface can be suppressed because the resin 19 diffused to the peripheral portion of the wafer 30 during resin sealing is allowed to fall into the U-shaped groove G in the wafer edge portion. As a result, as in the case of the aforementioned third embodiment, a heretofore-unachieved wafer back grinding process after a resin sealing step can be realized without providing wafer cracking due to the resin overflow as observed in conventional technologies, and almost all steps can be performed in a thick-wafer state. Thus, the risk of wafer cracking can be further reduced.

The invention claimed is:

1. A method of manufacturing a semiconductor device, comprising the steps of:
   a first step of forming an insulating film on a first surface on a front side of a semiconductor wafer, the front side of which a plurality of devices formed thereon, the insulating film having an opening portion from which an electrode pad of each device is exposed;
   next, a second step of forming a conductor layer on the insulating film, the conductor layer being patterned in a required shape to cover the opening portion from which the electrode pad is exposed;
   next, a third step of forming a resist layer on the conductor layer, so as to have an opening portion from which a terminal formation portion of the conductor layer is exposed;
   next, a fourth step of forming a metal post on the terminal formation portion of the conductor layer with the resist layer being used as a mask, wherein the metal post is at a same height from the first surface as the resist layer, wherein an almost planarized surface is formed above the front side;
   next, a fifth step of performing thinning of the semiconductor wafer to a predetermined thickness by grinding a back surface on a back side thereof which is reverse to the front side having the metal post formed thereon;
   next, a sixth step of sealing a front-side wafer surface with sealing resin, with a top portion of the metal post being exposed, after removing the resist layer;
   next, a seventh step of bonding a metal bump to the top portion of the metal post; and
   next, an eighth step of dividing the semiconductor wafer having the metal bump bonded thereto to separate said device from other of the plurality of devices.

2. The method according to claim 1, further comprising, immediately before the step of sealing the front-side wafer surface with sealing resin, a step of forming an insulating resin layer on the back-side wafer surface, to which the thinning has been performed, of the semiconductor wafer.

3. The method according to claim 1, wherein, in the step of forming a metal post, a barrier metal layer is further formed on the top portion of the metal post after the metal post is formed.

4. The method according to claim 1, wherein, in the step of forming an insulating film, the opening portion is formed by photolithography.

5. The method according to claim 1, wherein the metal post is at a same height from the first surface as the resist layer, within approximately one percent.

6. A method of manufacturing a semiconductor device, comprising the steps of:
   a first step of forming an insulating film on a first surface on a front side of a semiconductor wafer, the front side of which a plurality of devices formed thereon, the insulating film having an opening portion from which an electrode pad of each device is exposed;
   next, a second step of forming a thin metal film on an entire surface of the insulating film, so as to cover the opening portion from which the electrode pad is exposed;
   next, a third step of forming a resist layer on the thin metal film, the resist layer being patterned in a required shape;
   next, a fourth step of forming a reroute layer on the thin metal film with the resist layer being used as a mask;
   next, a fifth step of performing thinning of the semiconductor wafer to a predetermined thickness by grinding a back surface on a back side thereof which is reverse to the front side having the reroute formed thereon;
   next, a sixth step of forming a metal post on a terminal formation portion of the reroute layer, after removing the resist layer;
   next, a seventh step of removing the thin metal film;
   next, an eighth step of sealing a front-side wafer surface with sealing resin, with a top portion of the metal post being exposed;
   next, a ninth step of bonding a metal bump to the top portion of the metal post; and
   next, a tenth step of dividing the semiconductor wafer having the metal bump bonded thereto into each device.

7. The method according to claim 6, further comprising, immediately before the step of sealing the wafer surface with sealing resin, a step of forming an insulating resin layer on the back-side wafer surface, to which the thinning has been performed, of the semiconductor wafer.

8. The method according to claim 6, wherein, in the step of forming a metal post, a barrier metal layer is further formed on the top portion of the metal post after the metal post is formed.

9. The method according to claim 6, wherein, in the step of forming an insulating film, the opening portion is formed by photolithography.

* * * * *